(12) United States Patent
Shen et al.

(10) Patent No.: US 7,296,216 B2
(45) Date of Patent: Nov. 13, 2007

(54) STOPPING AND/OR REDUCING OSCILLATIONS IN LOW DENSITY PARITY CHECK (LDPC) DECODING

(75) Inventors: Ba-Zhong Shen, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 299 days.

(21) Appl. No.: 10/370,136

(22) Filed: Feb. 19, 2003

(65) Prior Publication Data

US 2004/0148561 A1 Jul. 29, 2004

Related U.S. Application Data

(60) Provisional application No. 60/442,029, filed on Jan. 23, 2003.

(51) Int. Cl.
*G06F 11/00* (2006.01)
(52) U.S. Cl. ............... 714/801; 714/782; 714/783; 714/784
(58) Field of Classification Search ............ 714/800, 714/803, 782–784, 792, 795
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,563,897 A * | 10/1996 | Pyndiah et al. ............ | 714/755 |
| 6,108,388 A * | 8/2000 | Douillard et al. .......... | 375/348 |
| 6,430,233 B1 | 8/2002 | Dillon et al. | |
| 6,473,010 B1 | 10/2002 | Vityaev et al. | |
| 6,539,367 B1 * | 3/2003 | Blanksby et al. ........... | 706/14 |
| 6,567,465 B2 | 5/2003 | Goldstein et al. | |
| 6,633,856 B2 | 10/2003 | Richardson et al. | |
| 2003/0033575 A1 * | 2/2003 | Richardson et al. ........ | 714/799 |
| 2003/0104788 A1 | 6/2003 | Kim | |
| 2003/0229843 A1 * | 12/2003 | Yu et al. ..................... | 714/794 |

OTHER PUBLICATIONS

Yu Kou et al. Low-Density Parity-Check Codes Based on Finite Geometries: A Rediscory and New Results.IEEE Transaction on Information Theory, vol. 47, No. 7 Nov. 2001.*

(Continued)

*Primary Examiner*—Guy Lamarre
*Assistant Examiner*—Sam Rizk
(74) *Attorney, Agent, or Firm*—Garlick Harrison & Markison; Shayne X. Short

(57) ABSTRACT

Stopping or reducing oscillations in Low Density Parity Check (LDPC) codes. A novel solution is presented that completely eliminates and/or substantially reduces the oscillations that are oftentimes encountered with the various iterative decoding approaches that are employed to decode LDPC coded signals. This novel approach may be implemented in any one of the following three ways. One way involves combining the Sum-Product (SP) soft decision decoding approach with the Bit-Flip (BF) hard decision decoding approach in an intelligent manner that may adaptively select the number of iterations performed during the SP soft decoding process. The other two ways involve modification of the manner in which the SP soft decoding approach and the BF hard decision decoding approach are implemented. One modification involves changing the initialization of the SP soft decoding process, and another modification involves the updating procedure employed during the SP soft decoding approach process.

82 Claims, 22 Drawing Sheets

OTHER PUBLICATIONS

R. Gallaher, Low-Density Parity-Check Codes, Cambridge, MA: MIT Press, 1963.

D.J.C. MacKay, "Good error Correcting codes based on very sparse matrices," IEEE Trans. Inform. Theory, vol. 45, pp. 399-431, Mar. 1999.

T. J. Richardson and R. L. Urbanke, "The capacity of low-density parity-check code under message-passing decoding," IEEE Trans. Inform. Theory, vol. 47, pp. 599-618, Feb. 2001.

Yu Kou, Shu Lin, and Marc P.C. Fossorier, "Low-Density Parity-Check Codes Based on Finite Geometries: A Rediscovery and New Results," IEEE Trans. Inform. Theory, vol. 47, No. 7, pp. 2711-2736, Nov. 2001.

M. Luby, M. Mitzenmacher, A. Shokrollahi, D. Spielman, and V. Stemann, "Practical loss-resilient codes," 1997.

Kevin P. Murphy, Yair Weiss, Michael I. Jordan, "Loopy belief propagation for approximate interence: an empirical study," in Proc. Uncertainty in Artificial Intelligence, 1999.

E. Eleftheriou and S. Olcer, "Low-Density Parity-Check Codes for Digital Subscriber Lines," 0-7803-7400-Feb. 2002, IEEE, 2002, pp. 1752-1757.

* cited by examiner

High Definition Television (HDTV) communication system uni-directional microwave communication system bi-directional microwave communication system uni-directional point-to-point radio communication system bi-directional point-to-point radio communication system fiber-optic communication system satellite receiver set-top box system Low Density Parity Check (LDPC) code bipartite graph functionality of decoding Low Density Parity Check (LDPC) code as finding a fixed point 2-dimensional fixed point animation

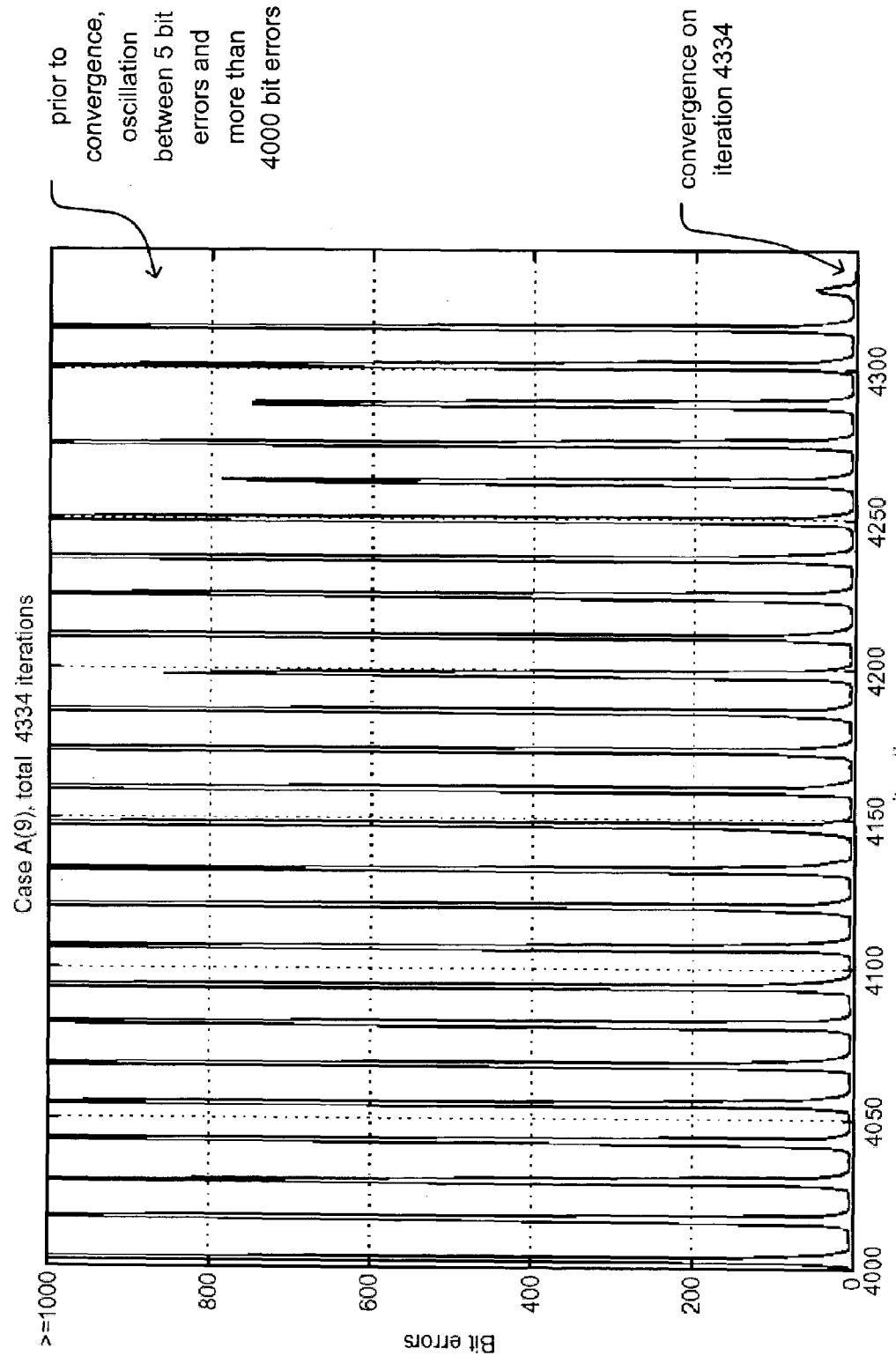

combination Sum-Product (SP) soft decision decoding and Bit-Flip (BF) hard decision decoding combination Sum-Product (SP) soft decision decoding and Bit-Flip (BF) hard decision decoding modified Sum-Product (SP) soft decision decoding initialization decoding processing that capitalizes on improved initialization (approach 1)

decoding processing that capitalizes on improved initialization (approach 2)

momentum modified Sum-Product (SP) soft decision decoding processing updated using previous 2 iterations shortened oscillations using momentum modified Sum-Product (SP) soft decision decoding processing

STOPPING AND/OR REDUCING OSCILLATIONS IN LOW DENSITY PARITY CHECK (LDPC) DECODING

CROSS REFERENCE TO RELATED PATENTS/PATENT APPLICATIONS

The present U.S. Utility Patent Application claims priority pursuant to 35 U.S.C. § 119(e) to the following U.S. Provisional Patent Applications which is hereby incorporated herein by reference in its entirety and made part of the present U.S. Utility Patent Application for all purposes:

1. U.S. Provisional Application Ser. No. 60/442,029, "Stopping and/or reducing oscillations in Low Density Parity Check (LDPC) codes," filed Jan. 23, 2003 (01/23/03), pending.

BACKGROUND OF THE INVENTION

1. Technical Field of the Invention

The invention relates generally to communication systems; and, more particularly, it relates to decoding of encoded signals within such communication systems.

2. Description of Related Art

Data communication systems have been under continual development for many years. One such type of communication system that has been of significant interest lately is a communication system that employs turbo codes. Another type of communication system that has also received interest is a communication system that employs Low Density Parity Check (LDPC) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular Signal to Noise Ratio (SNR), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

There is, however, at least one undesirable aspect of decoding processing of LDPC coded signals. The decoding of LDPC codes typically involves using iterative processing; this iterative processing inherently includes some loops. There are several approaches that may be used to perform decoding of LDPC codes. One approach involves a Belief Propagation (BP) decoding approach. The BP approach may be implemented either using a Sum Product (SP) approach or a Message Passing (MP) approach. However, given the fact that the manner in which these LDPC codes are decoded include loops, the possibility of oscillations may arise in the decoding within theses loops.

As described very accurately by Pearl, "when loops are present, the network is no longer singly connected and local propagation schemes will invariably run into trouble . . . If we ignore the existence of loops and permit the nodes to continue communicating with each other as if the network were singly connected, messages may circulate indefinitely around the loops and process may not converges to a stable equilibrium . . . Such oscillations do not normally occur in probabilistic networks. . . which tend to bring all messages to some stable equilibrium as time goes on. However, this asymptotic equilibrium is not coherent, in the sense that it does not represent the posterior probabilities of all nodes of the network." J. Pearl, *Probabilistic Reasoning in Intelligent Systems: Networks of Plausible Inference*, Morgan Kaufmann, 1988.

As can clearly be seen by the description provided above, a need exists in the art to try to deal with these undesirable oscillations that can sometimes occur when decoding LDPC coded signals within communication decoders.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 12 is a diagram illustrating an example of oscillations caused when decoding a Low Density Parity Check (LDPC) coded block (last 100s of iterations are shown).

DETAILED DESCRIPTION OF THE INVENTION

Various aspects of the invention may be found in any number of devices that perform decoding of Low Density Parity Check (LDPC) coded signals. Decoders that are operable to perform reduced and/or completely eliminated during the decoding processing. As described above, the typical approaches to decoding LDPC coded signals inherently involve loops. When an iterative decoding approach does not converge, then the error may be passed continuously throughout the loop. The invention provides several possible embodiments that may be addressed to reduce and/or completely eliminate the possible oscillations that may undesirably occur when decoding LDPC coded signals. Various system embodiments are described below where any of the various aspects of the invention may be implemented. In general, any device that performs decoding of LDPC coded signals may benefit from the invention.

Figure 1:
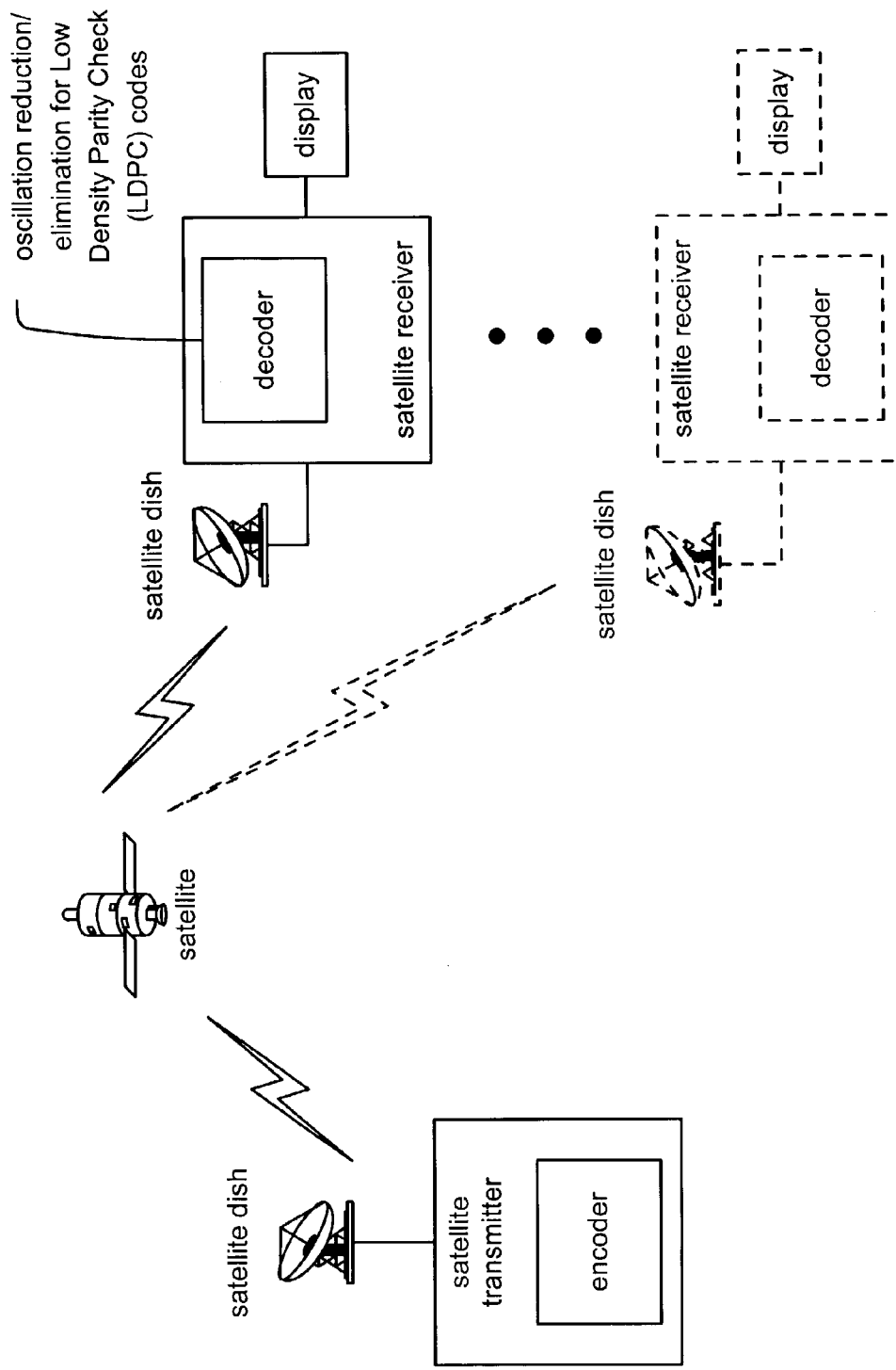
FIG. 1 is a system diagram illustrating an embodiment of a satellite communication system that is built according to the invention.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks. The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). The decoder may be implemented within the satellite receivers may be implemented to perform oscillation reduction and/or elimination when decoding Low Density Parity Check (LDPC) coded signals. The FIG. 1 shows just one of the many embodiments where oscillation reduction and/or elimination for LDPC codes may be performed according to the invention.

Figure 2:
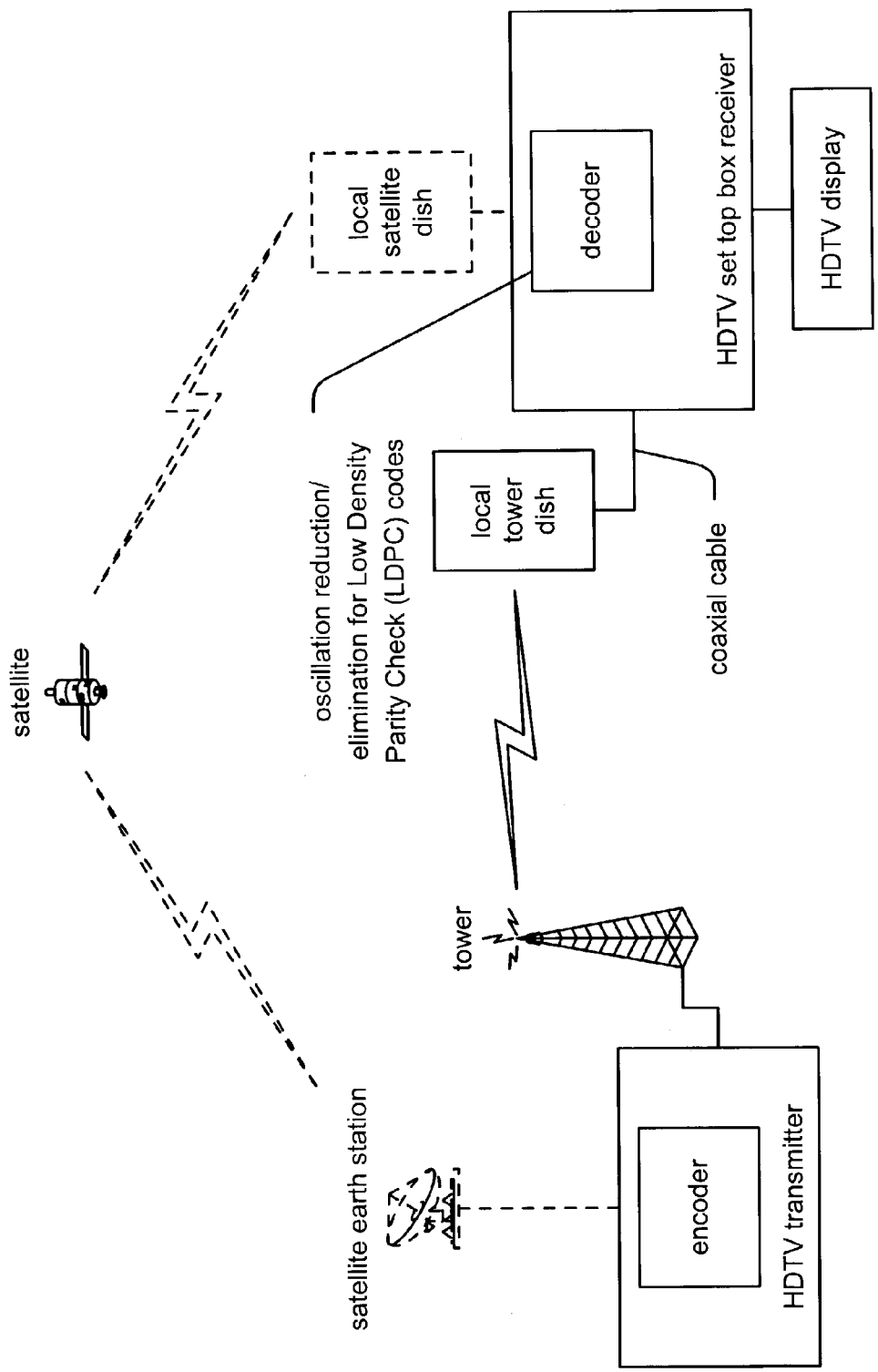
FIG. 2 is a system diagram illustrating an embodiment of a High Definition Television (HDTV) communication system that is built according to the invention.

FIG. 2 is a system diagram illustrating an embodiment of a High Definition Television (HDTV) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV set top box receiver via a coaxial cable. The HDTV set top box receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower.

The HDTV set top box receiver is also communicatively coupled to an HDTV display that is able to display the demodulated and decoded wireless transmitted signals received by the HDTV set top box receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV set top box receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV set top box receiver via a coaxial cable. This path of transmission shows yet another communication path where the HDTV set top box receiver may communicate with the HDTV transmitter.

In whichever embodiment and whichever signal path the HDTV transmitter employs to communicate with the HDTV set top box receiver, the HDTV set top box receiver is operable to receive communication transmissions from the HDTV transmitter.

The HDTV transmitter is operable to encode information (using an encoder) that is to be transmitted to the HDTV set top box receiver; the HDTV set top box receiver is operable to decode the transmitted signal (using a decoder). The decoder may be implemented within the HDTV set top box receiver may be implemented to perform oscillation reduction and/or elimination when decoding Low Density Parity Check (LDPC) coded signals. The FIG. 2 shows yet another embodiment where oscillation reduction and/or elimination for LDPC codes may be performed according to the invention.

Figure 3A:
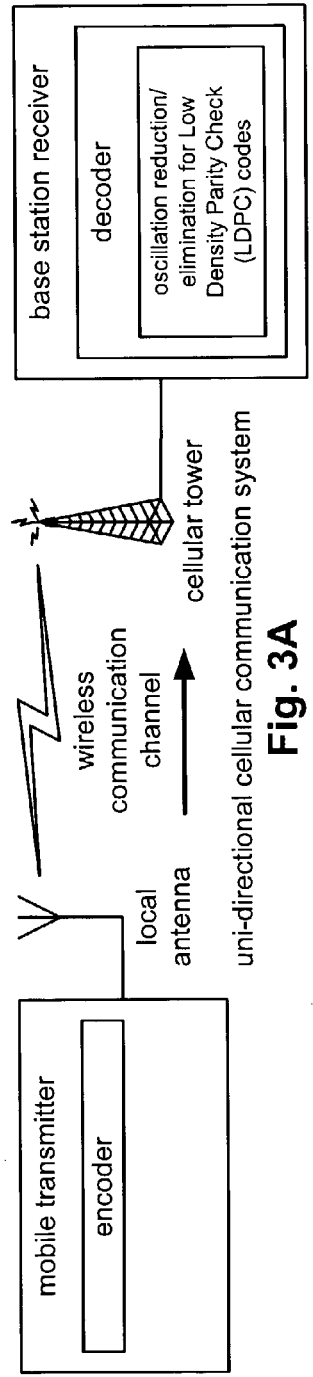
FIG. 3A and FIG. 3B are system diagrams illustrating embodiment of uni-directional cellular communication systems that are built according to the invention.
Figure 3B:
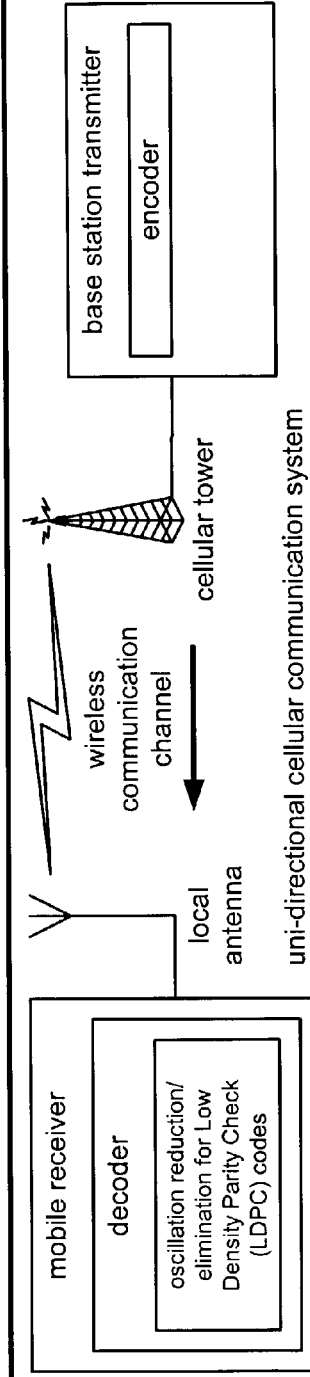

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmit functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder).

The decoder may be implemented within the base station receiver to perform oscillation reduction and/or elimination when decoding Low Density Parity Check (LDPC) coded signals. The FIG. 3A shows yet another embodiment where oscillation reduction and/or elimination may be performed according to the invention when decoding LDPC codes. The FIG. 3A shows a unidirectional cellular communication system where the communication goes from the mobile transmitter to the base station receiver via the wireless communication channel.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder).

The decoder may be implemented within the mobile receiver to perform oscillation reduction and/or elimination when decoding Low Density Parity Check (LDPC) coded signals. The FIG. 3B shows yet another embodiment where oscillation reduction and/or elimination may be performed according to the invention when decoding LDPC codes. The FIG. 3B shows a uni-directional cellular communication system where the communication goes from the base station transmitter to the mobile receiver via the wireless communication channel.

Figure 3C:
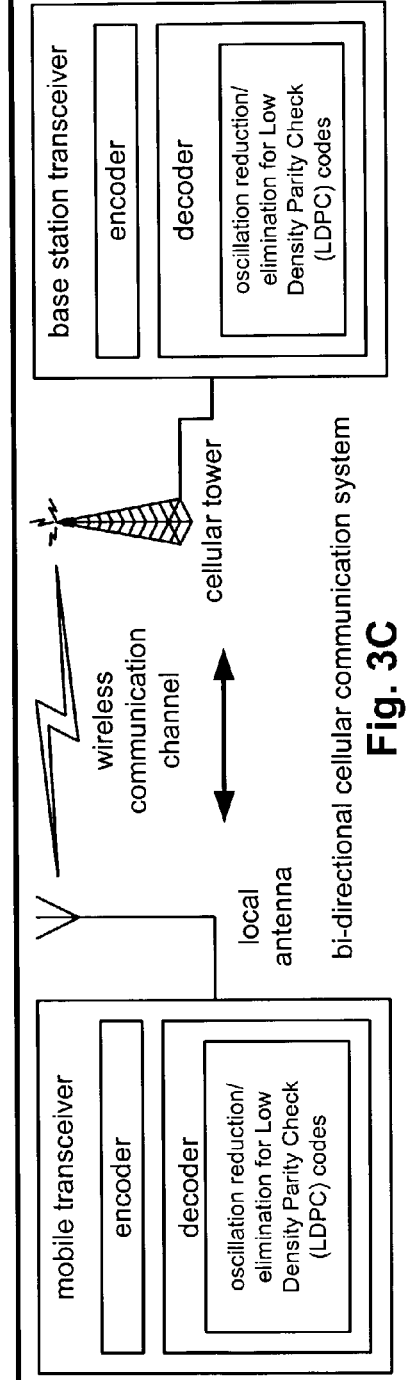
FIG. 3C is a system diagram illustrating embodiment of a bi-directional cellular communication system that is built according to the invention.

The FIG. 3C shows a bi-directional cellular communication system where the communication can go to and from the base station transceiver and to and from the mobile transceiver via the wireless communication channel.

Referring to the FIG. 3C, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using an encoder) that is to be transmitted to the mobile transceiver; the mobile transceiver is operable to decode the transmitted signal (using a decoder).

The decoder may be implemented within either one of the mobile transceiver and the base station transceiver to perform oscillation reduction and/or elimination when decoding Low Density Parity Check (LDPC) coded signals. The FIG. 3C shows yet another embodiment where oscillation reduction and/or elimination for LDPC codes may be performed according to the invention when decoding LDPC codes.

Figure 4A:
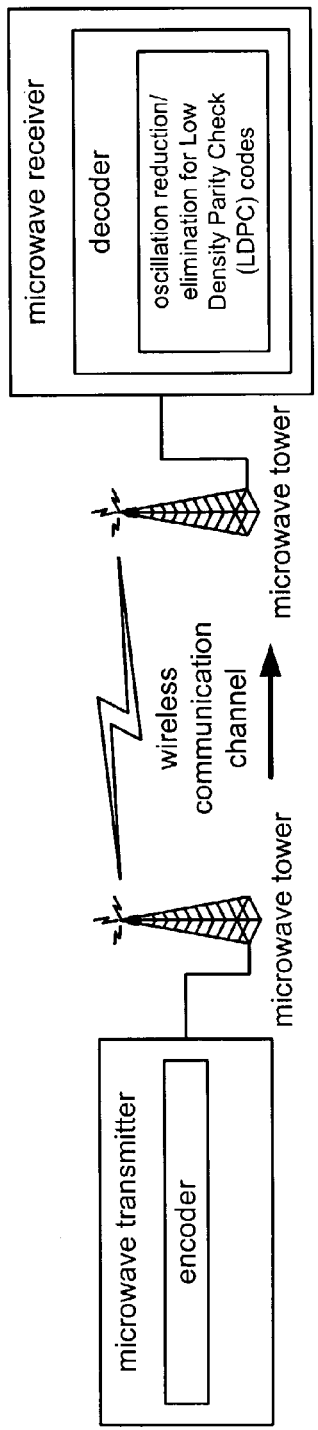
FIG. 4A is a system diagram illustrating embodiment of a uni-directional microwave communication system that is built according to the invention.

FIG. 4A is a system diagram illustrating embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder).

The decoder may be implemented within the microwave receiver to perform oscillation reduction and/or elimination when decoding Low Density Parity Check (LDPC) coded signals. The FIG. 4A shows yet another embodiment where oscillation reduction and/or elimination may be performed according to the invention when decoding LDPC codes. The FIG. 4A shows a uni-directional microwave communication system where the communication goes from the microwave transmitter to the microwave receiver via the wireless communication channel.

Figure 4B:
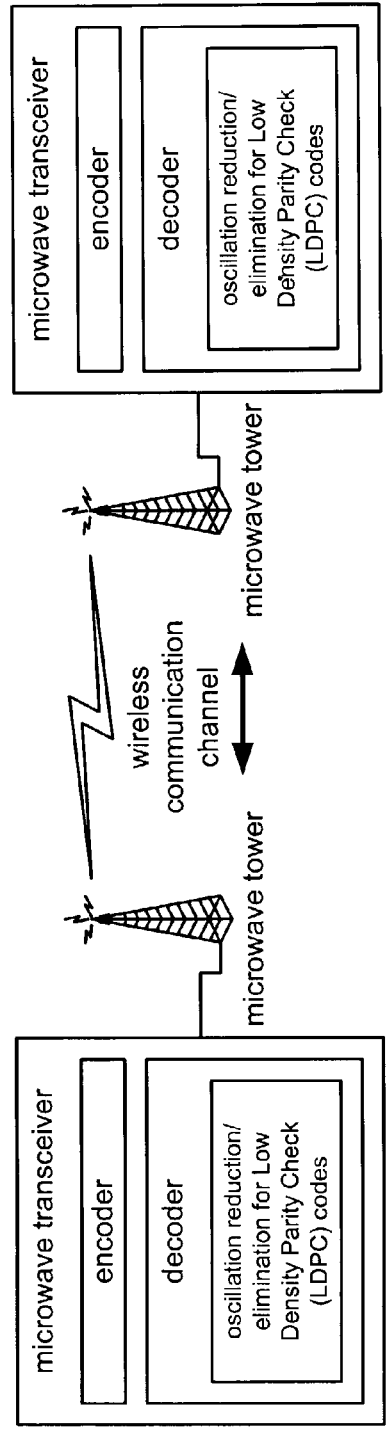
FIG. 4B is a system diagram illustrating embodiment of a bi-directional microwave communication system that is built according to the invention.

FIG. 4B is a system diagram illustrating embodiment of a bi-directional microwave communication system that is built according to the invention. Within the FIG. 4B, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder. The decoder of either of the transceivers that may be implemented to perform oscillation reduction and/or elimination when decoding Low Density Parity Check (LDPC) coded signals. The FIG. 4B shows yet another embodiment where oscillation reduction and/or elimination may be performed according to the invention when decoding LDPC codes.

Figure 5A:
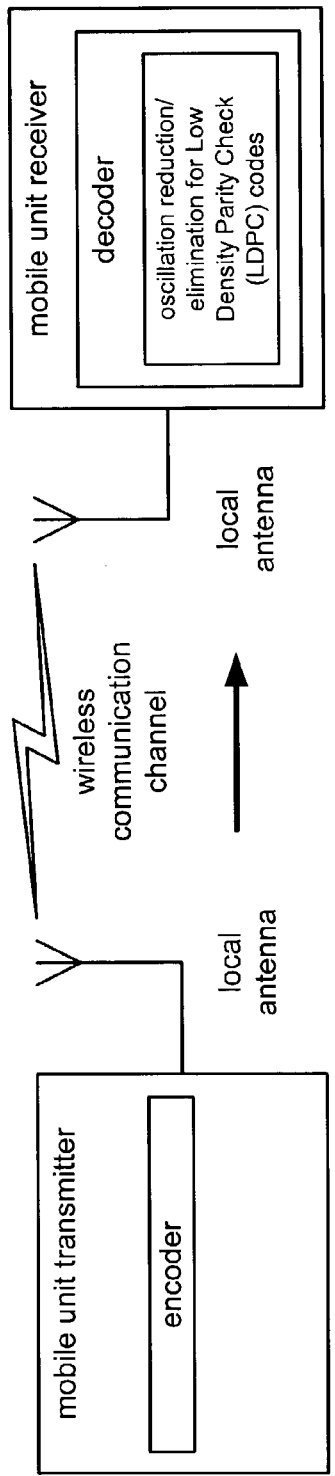
FIG. 5A is a system diagram illustrating embodiment of a uni-directional point-to-point radio communication system that is built according to the invention.

FIG. 5A is a system diagram illustrating embodiment of a uni-directional point-to-point radio communication system that is built according to the invention. A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder). The decoder may be implemented within the mobile unit receiver to perform oscillation reduction and/or elimination when decoding Low Density Parity Check (LDPC) coded signals. The FIG. 5A shows yet another embodiment where oscillation reduction and/or elimination may be performed according to the invention when decoding LDPC codes.

The FIG. 5A shows a uni-directional communication system where the communication goes from the mobile unit transmitter to the mobile unit receiver via the wireless communication channel.

Figure 5B:
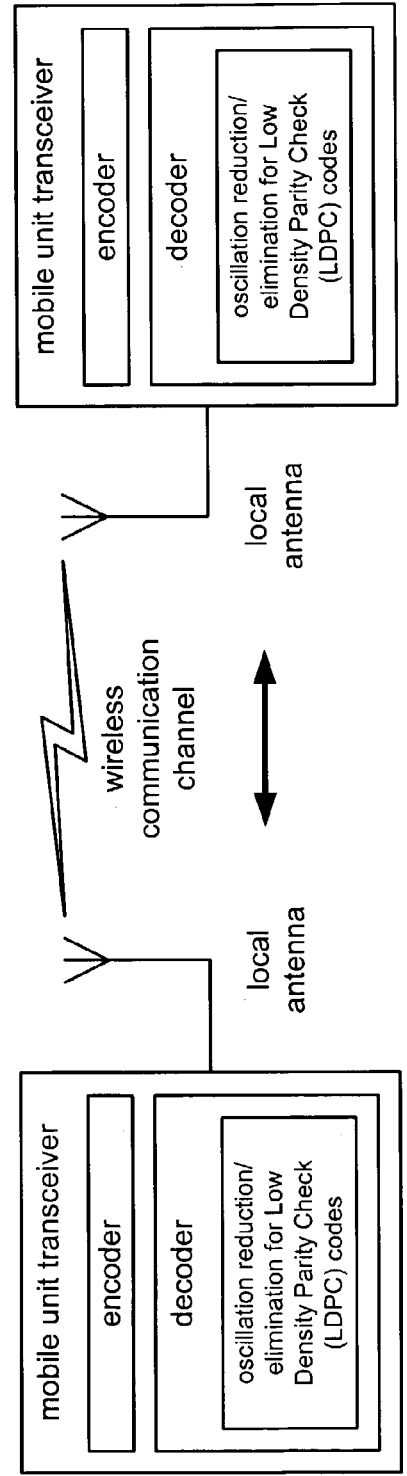
FIG. 5B is a system diagram illustrating embodiment of a bi-directional point-to-point radio communication system that is built according to the invention.

FIG. 5B is a system diagram illustrating embodiment of a bi-directional point-to-point radio communication system that is built according to the invention. Within the FIG. 5B, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using an encoder) that is to be transmitted to the other mobile unit transceiver; each mobile unit transceiver is operable to decode the transmitted signal (using a decoder) that it receives. The decoder of either of the mobile unit transceivers may be implemented to perform oscillation reduction and/or elimination when decoding Low Density Parity Check (LDPC) coded signals. The FIG. 5B shows yet another embodiment where oscillation reduction and/or elimination may be performed according to the invention when decoding LDPC codes.

Figure 6A:
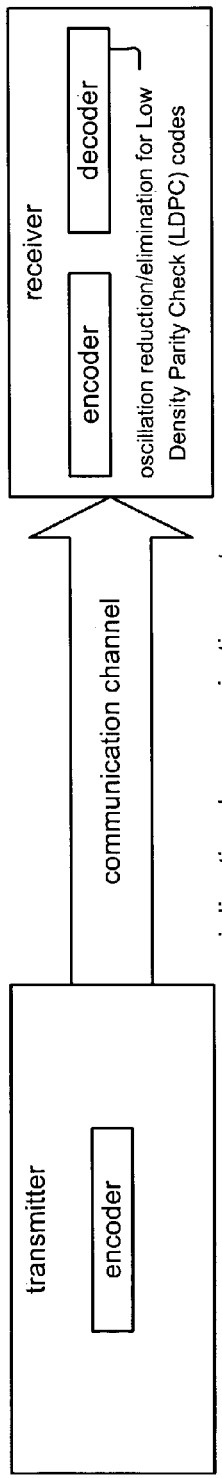
FIG. 6A is a system diagram illustrating embodiment of a uni-directional communication system that is built according to the invention.

FIG. 6A is a system diagram illustrating embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder). The decoder may be implemented within the receiver to perform oscillation reduction and/or elimination when decoding Low Density Parity Check (LDPC) coded signals. The FIG. 6A shows yet another embodiment where oscillation reduction and/or elimination may be performed according to the invention when decoding LDPC codes. The FIG. 6A shows a uni-directional communication system where the communication goes from the transmitter to the receiver via the communication channel.

Figure 6B:
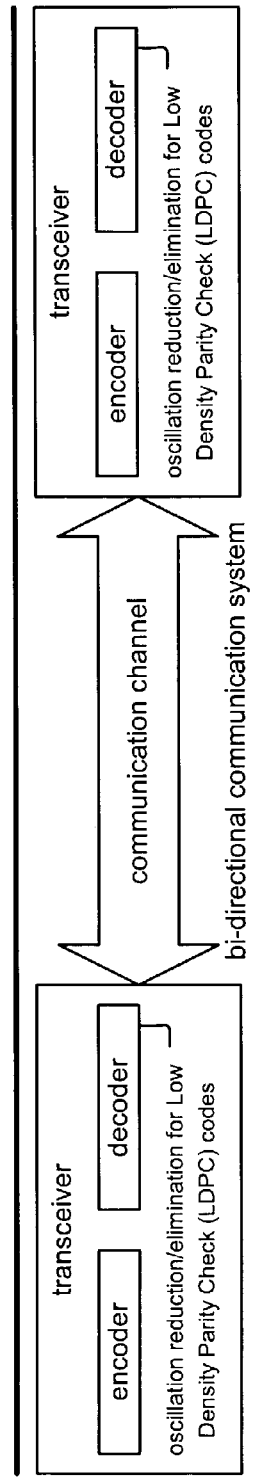
FIG. 6B is a system diagram illustrating embodiment of a bi-directional communication system that is built according to the invention.

FIG. 6B is a system diagram illustrating an embodiment of a bi-directional communication system that is built according to the invention. Within the FIG. 6B, a first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using an encoder) that is to be transmitted to the other transceiver; each transceiver is operable to decode the transmitted signal (using a decoder) that it receives. The decoder of either of the transceivers may be implemented to perform oscillation reduction and/or elimination when decoding Low Density Parity Check (LDPC) coded signals. The FIG. 6B shows yet another embodiment where oscillation reduction and/or elimination may be performed according to the invention when decoding LDPC codes.

Figure 6C:
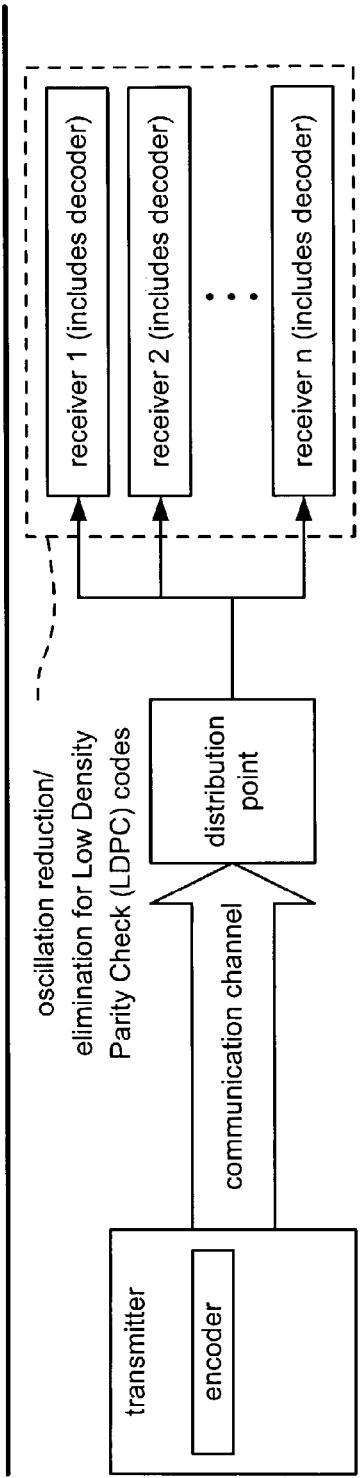
FIG. 6C is a system diagram illustrating embodiment of a one to many communication system that is built according to the invention.

FIG. 6C is a system diagram illustrating embodiment of a one to many communication system that is built according to the invention. A transmitter is able to communicate, via broadcast in certain embodiments, with a number of receivers, shown as receivers 1, 2, ..., n via a uni-directional communication channel. The uni-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

A distribution point is employed within the one to many communication system to provide the appropriate communication to the receivers 1, 2, ..., and n. In certain embodiments, the receivers 1, 2, ..., and n each receive the same communication and individually discern which portion of the total communication is intended for themselves.

The transmitter is operable to encode information (using an encoder) that is to be transmitted to the receivers 1, 2, ..., and n; each of the receivers 1, 2, ..., and n is operable to decode the transmitted signal (using a decoder). The decoder that may be implemented within each of the receivers 1, 2, ..., and n to perform oscillation reduction and/or elimination when decoding Low Density Parity Check (LDPC) coded signals. The FIG. 8C shows yet another embodiment where oscillation reduction and/or elimination may be performed according to the invention when decoding LDPC codes.

Figure 7:
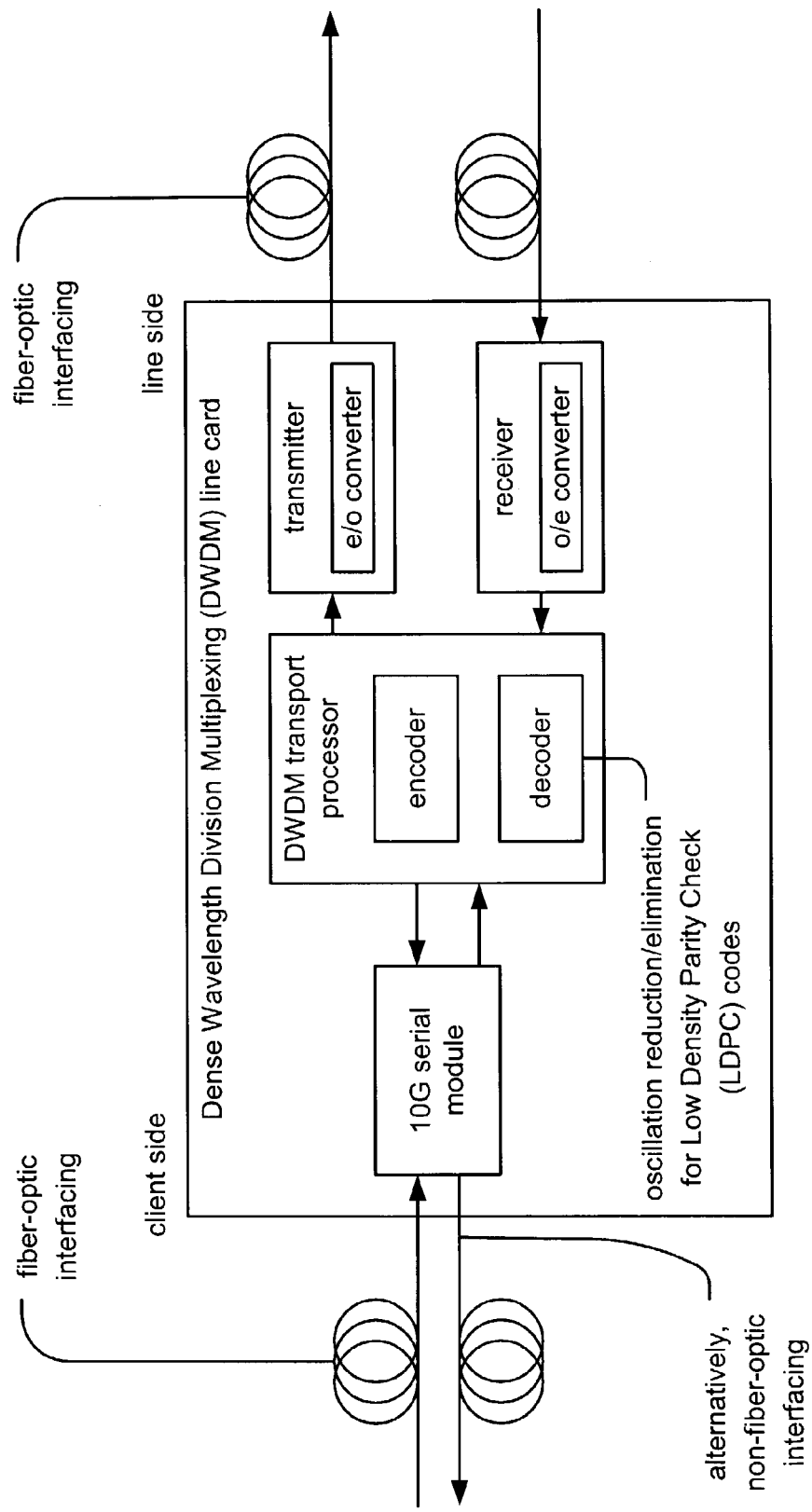
FIG. 7 is a system diagram illustrating an embodiment of a fiber-optic communication system that is built according to the invention.

FIG. 7 is a system diagram illustrating an embodiment of a fiber-optic communication system that is built according to the invention. The fiber-optic communication system is operable to support oscillation reduction and/or elimination when decoding Low Density Parity Check (LDPC) coded signals. The fiber-optic communication system includes a Dense Wavelength Division Multiplexing (DWDM) line card that is interposed between a line side and a client side.

DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a physical layer architecture (PHY), it can transparently support both Time Division Multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The decoder may be implemented within the receiver to perform oscillation reduction and/or elimination when decoding Low Density Parity Check (LDPC) coded signals. The FIG. 7 shows yet another embodiment where oscillation reduction and/or elimination may be performed according to the invention when decoding LDPC codes.

Figure 8:
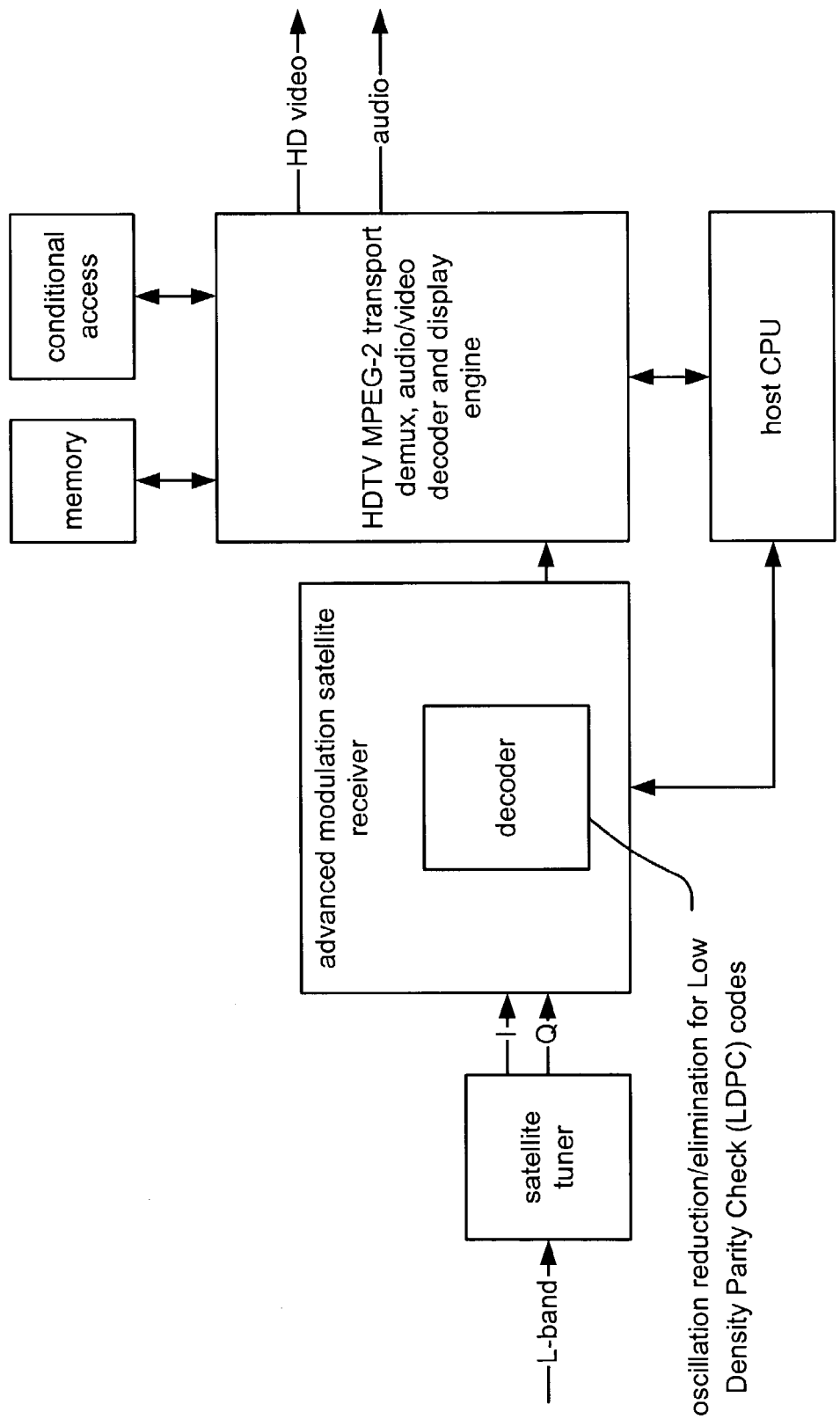
FIG. 8 is a system diagram illustrating an embodiment of a satellite receiver set-top box system that is built according to the invention.

FIG. 8 is a system diagram illustrating an embodiment of a satellite receiver set-top box system that is built according to the invention. The satellite receiver set-top box system includes an advanced modulation satellite receiver that is implemented in an all digital architecture. The satellite receiver set-top box system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes an embodiment of the decoder. The decoder is operable to support oscillation reduction and/or elimination when decoding Low Density Parity Check (LDPC) coded signals.

The advanced modulation satellite receiver communicatively couples to an HDTV MPEG-2 (Motion Picture Expert Group) transport de-mux, audio/video decoder and display engine. The advanced modulation satellite receiver and the HDTV MPEG-2 transport de-mux, audio/video decoder and display engine communicatively couple to a host Central Processing Unit (CPU). The HDTV MPEG-2 transport de-mux, audio/video decoder and display engine also communicatively couples to a memory module and a conditional access functional block. The HDTV MPEG-2 transport de-mux, audio/video decoder and display engine provides HD video and audio output that may be provided to an HDTV display.

The advanced modulation satellite receiver is a single-chip digital satellite receiver supporting the decoder that is operable to support oscillation reduction and/or elimination when decoding Low Density Parity Check (LDPC) coded signals. The advanced modulation satellite receiver is operable to receive communication provided to it from a transmitter device that includes an encoder as well.

In addition, several of the following Figures describe particular embodiments that may be used to implement the various embodiments of oscillation reduction and/or elimination when decoding Low Density Parity Check (LDPC) coded signals according to the invention.

Figure 9:
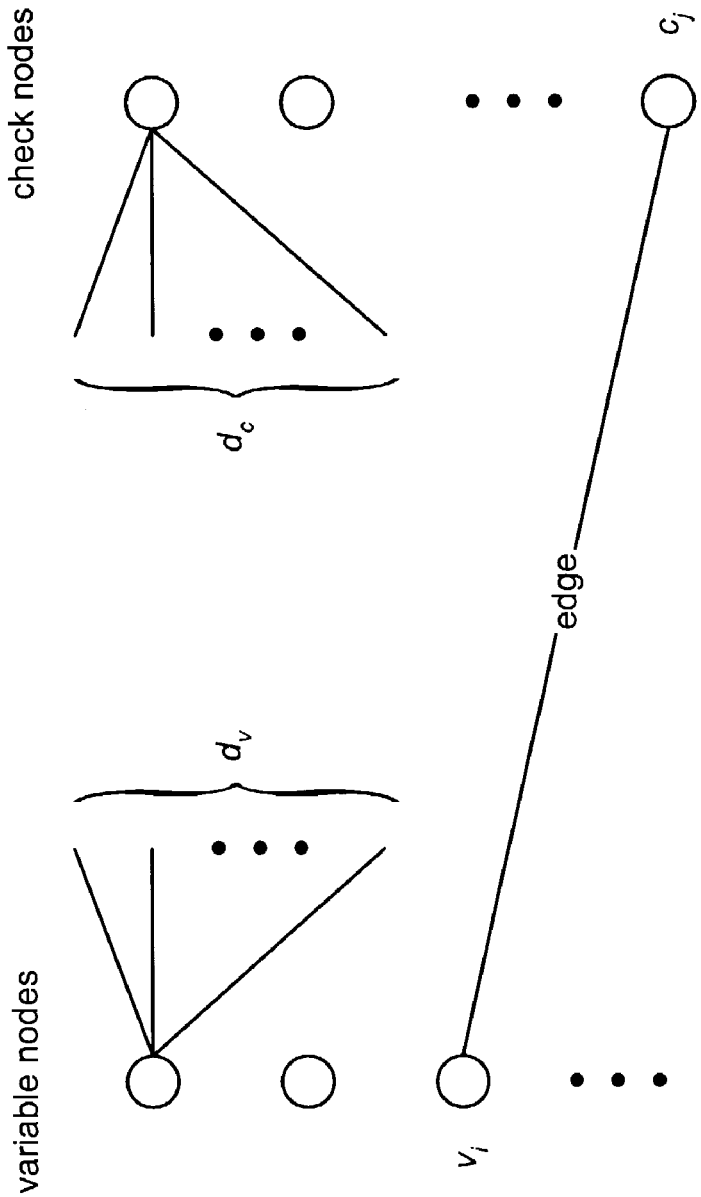
FIG. 9 is a diagram illustrating an embodiment of a Low Density Parity Check (LDPC) code bipartite graph.

FIG. 9 is a diagram illustrating an embodiment of a Low Density Parity Check (LDPC) code bipartite graph. An LDPC code may be viewed as being a code having a binary parity check matrix such that nearly all of the elements of the matrix have values of zeros. For example, $H=(h_{i,j})_{M \times N}$ may be viewed as being a parity check matrix of an LDPC code with block length N. If every column of the matrix has $d_v$ 1's, and every row of the matrix has $d_c$ 1's, then this code is called a $(d_v, d_c)$ regular LDPC code. For example, a regular (4,72) LDPC code would be viewed as being a code whose binary parity check matrix would have 4 1's in every column and 72 1's in every row.

These regular LDPC codes were introduced in R. Gallager, *Low-Density Parity-Check Codes*, Cambridge, Mass.: MIT Press, 1963. A regular LDPC code can be defined as a bipartite graph by its parity check matrix with left side nodes representing variable of the code bits, and the right side nodes representing check equations. The bipartite graph of the code defined by H, shown in the FIG. 9, may be defined by N variable nodes and M check nodes. Every variable node of the N variable nodes has exactly $d_v$ edges connecting this node to one or more of the check nodes (within the check M nodes). This number of dv edges may be referred to as the degree of a variable node. Analogously, every check node of the M check nodes has exactly $d_c$ edges connecting this node to one or more of the variable nodes. This number of $d_c$ edges may be referred to as the degree of a check node.

Referring to FIG. 9, an edge between a variable node $v_i$ and check node $c_j$ may be defined by $e=(i, j)$. However, on the other hand, given an edge $e=(i, j)$, the nodes of the edge may alternatively be denoted as by $e=(v(e), c(e))$. Given a variable node $v_i$, we may define the set of edges emitting from the node $v_i$ by $E_v(i)=\{e|v(e)=i\}$. Given a check node $c_j$, we may define the set of edges emitting from the node $c_j$ by $E_c(j)=\{e|c(e)=j\}$. Continuing on, the derivative result will be $|E_v(i)|=d_v$ and $|E_c(j)|=d_c$.

An irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes.

The concept of irregular LDPC codes were originally introduced by the authors of M. Luby, M. Mitzenmacher, M. A. Shokrollahi, D. A. Spielman. and V. Stemann. "Practical Loss-Resilient Codes," Proc. $29^{th}$ Symp. on Theory of Computing, 1997, pp. 150-159.

The Log-Likelihood ratio (LLR) decoding of LDPC codes may be described as follows: The probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is use to check the parity of the received vector. The LLR is the logarithm of the ratio of these two calculated probabilities. This LLR will give a measure of the degree to which the communication channel over which a signal is transmitted may undesirably affect the bits within the vector.

The Log-Likelihood ratio (LLR) decoding of LDPC codes may be described mathematically as follows:

Beginning with $$C = \{v \mid v = (v_0, \ldots, v_{N-1}), vH^T = 0\}$$

being an LDPC code and viewing a received vector, $y=(y_0, \ldots, y_{N-1})$, with the sent signal having the form of $((-1)^{v_{0i}}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric will then be defined as follows:

$$L_{metric}(i) = \ln \frac{p(y_i \mid v_i = 0)}{p(y_i \mid v_i = 1)}$$

For every variable node $v_i$, its LLR information value will then be defined as follows:

$$\ln \frac{p(v_i = 0 \mid y_i)}{p(v_i = 1 \mid y_i)} = L_{metric}(i) + \ln \frac{p(v_i = 0)}{p(v_i = 1)}$$

Since the variable node, $v_i$, is in a codeword, then the value of $$\ln\frac{p(v_i = 0)}{p(v_i = 1)}$$

may be replaced by $$\ln\frac{p(v_i = 0, vH^T = 0 \mid y)}{p(v_i = 1, vH^T = 0 \mid y)} = \sum_{(i,j) \in E_v(i)} \ln\frac{p(v_i = 0, vh_j^T = 0 \mid y)}{p(v_i = 1, vh_j^T = 0 \mid y)}$$

where $E_v$ (i) is a set of edges starting with $v_i$ as defined above.

When performing the Belief Propagation (BP) decoding approach, then the value of $$\ln\frac{p(v_i = 0, vh_j^T = 0 \mid y)}{p(v_i = 1, vh_j^T = 0 \mid y)}$$

may be replaced by the following relationship $$L_{check}(i, j) = \ln\frac{p\left(\sum_{e \in E_c(j)\setminus\{(i,j)\}} v_{v(e)} = 0 \mid y\right)}{p\left(\sum_{e \in E_c(j)\setminus\{(i,j)\}} v_{v(e)} = 1 \mid y\right)}$$

which is called the extrinsic (EXT) information of the check node $c_j$ with respect to the edge (i, j). Extrinsic information values may be viewed as those values that are calculated to assist in the generation of best estimates of actual bit values within a received vector. Also in a BP approach, then the extrinsic information of the variable node $v_i$ with respect to the edge (i, j) may be defined as follows:

$$L_{var}(i, j) = L_{metric}(i) + \sum_{(i,k) \in E_v(i)\setminus\{(i,j)\}} L_{check}(i, k)$$

For illustration within this disclosure, a rate 0.9446 regular LDPC code of block size 9198 is employed as an example. Several of the various embodiments of the invention are described within the context of operating on this particular LDPC code. However, it is clear that the various aspects of the invention may also be applied to other LDPC codes as well without departing from the scope and spirit of the invention; the use of this particular LDPC is illustrative. The number of $d_v$ edges and the number of $d_c$ edges of this illustrative LDPC code are $(d_v, d_c)=(4,72)$. Specifically, this indicates that each code bit node connects 4 check nodes and each check node connects 72 code bit node. In addition, there are 511 check equations.

As described above, and as can be seen within the LDPC code bipartite graph described here, given the fact that the manner in which many LDPC codes are decoded include loops, the possibility of oscillations may arise in the decoding within theses loops. The invention presents a solution that is operable to reduce and/or eliminate these undesirable oscillations that may sometimes occur when decoding LDPC codes.

Figure 10:
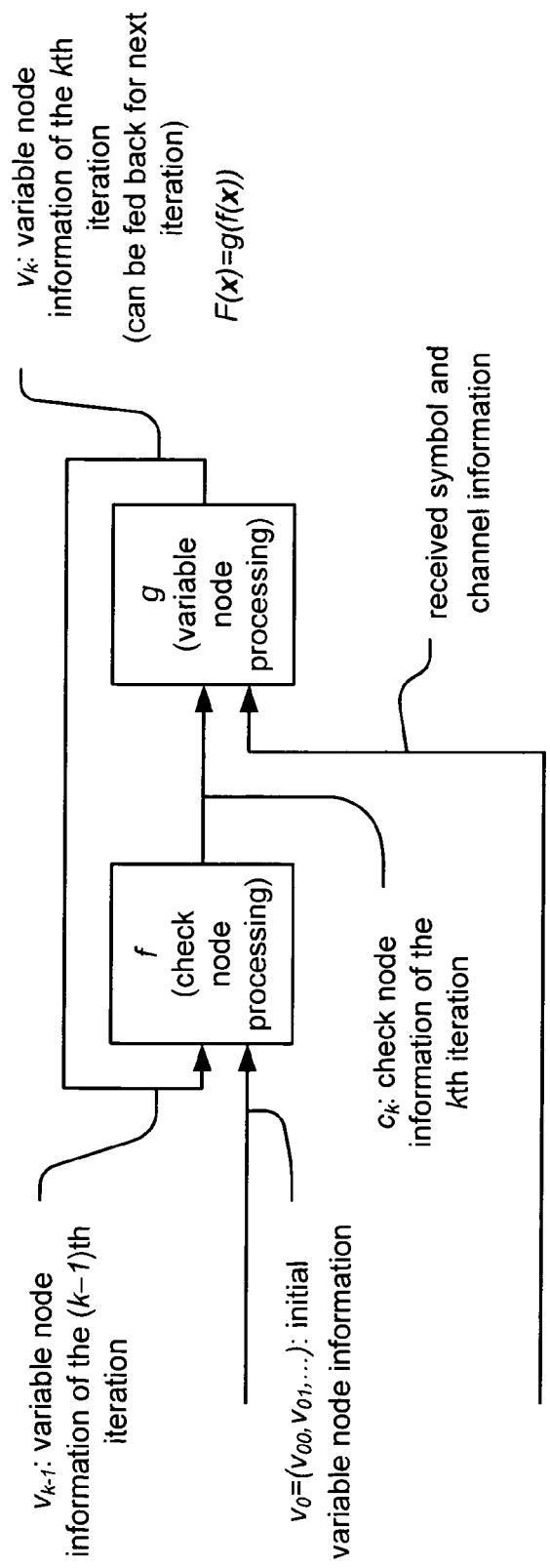
FIG. 10 is a diagram illustrating an embodiment of functionality of decoding Low Density Parity Check (LDPC) code as a fixed point according to the invention.

FIG. 10 is a diagram illustrating an embodiment of functionality of decoding Low Density Parity Check (LDPC) code as a fixed point according to the invention. As shown in this embodiment, one approach to perform decoding of an LDPC code is to employ the Sum-Product (SP) decoding approach. Descriptions of the SP decoding approach may be found in at least the following three references: (1) R. Gallager, *Low-Density Parity-Check Codes*, Cambridge, Mass.: MIT Press, 1963. (2) D. J. C. MacKay, "Good error Correcting codes based on very sparse matrices," *IEEE Trans. Inform. Theory*, Vol. 45, pp. 399-431, March 1999. (3) T. J. Richardson and R. L. Urbanke, "The Capacity of low-density parity-check codes under message-passing decoding," *IEEE Trans. Inform. Theory*, Vol. 47, pp. 599-618, February 2001.

In addition, a brief description of the SP decoding approach is also presented here. This brief description begins be defining a metric of a variable node, $v_i$, as follows:

$$\text{metric}_i(a) = p(y_i \mid v_i = a)$$

To initialize the decoding, the following definition may be employed:

$$\text{var}_e^0(a) = \text{metric}_{v(e)}(a)$$

Initially, the "Sum" portion of the SP decoding approach is performed. A check node value is calculated for each of the edges, e, of the LDPC code bipartite graph described above. These check node values may be shown mathematically as follows:

$$\text{check}_e^n(a) = P(c_{c(e)} = 0 \mid v_{v(e)} = a, y) = \sum_{u \in U_e(a)e'} \left( \prod_{e' = E_c(c(e)\setminus\{e\})} \text{var}_{e'}^{n-1}(u_{v(e')}) \right),$$

$$\text{where } U_e(a) = \left\{ u_t \in \{0, 1\}, (t, c(e)) \in E_c(c(e))\setminus\{e\} \;\middle|\; \sum_t u_t = a \right\}.$$

Subsequently, the "Product" potion of the SP decoding approach is performed. For each of the edges, e, of the LDPC code bipartite graph described above, the following calculation is made with respect to the variable nodes:

$$\text{var}_e^n(a) = P(v_{v(e)} = a \mid c_{c(e')} = 0, e' \in E_v(v(e))\setminus\{e\}, y)$$

$$\text{var}_e^n(a) = \text{metric}_{v(e)}(a) \prod_{e' \in E_v(v(e))\setminus\{e\}} \text{check}_{e'}^n(a)$$

Thereafter, the "Sum" portion and the "Product" portion of the SP decoding approach are combined together to give the final SP decoding result. Specifically, to estimate the SP decoding result after the n-th iteration, the following calculation may be performed:

$$P^{(n)}(v_i = a \mid y) = \text{metric}_i(a) \prod_{e \in E_v(i)} \text{check}_e^n(a)$$

The SP decoding approach is a Belief Propagation (BP) (and/or sometimes referred to as a Message-Passing (MP)) approach that is employed in a Bayesian network. The functionality performed by such as decoder may be considered as follows. The decoder starts with initial information that corresponds to all of the variable nodes; this information may be represented as a vector $v_0$. During the first SP decoding iteration, the decoder calculate the information of all the check nodes, which may be represented as the vector $c_1$, using the initial variable node information vector $v_0$. This operation may be represented as the following function: $c_1=f(v_0)$.

After this operation, this newly computed value of $c_1$ along with the metric sequence are both used to calculate the information that corresponds to all the variable nodes, this information may be represented as a variable node vector at iteration 1, shown as $v_1$. This procedure may be denotes as the following function: $v_1=g(c_1)$. It is also noted that the function of g also receives information corresponding to the communication channel over which a received symbol has been transmitted; this information may include its noise characterization, its dispersive nature, its Signal to Noise (SNR), and/or other information as well.

The notation used herein may be defined as follows: the "variable" node information and the "check" node information in the kth iteration may be represented as $v_k$ and $c_k$, respectively. Therefore, the check node information of the kth iteration may be represented as $c_k=f(v_{k-1})$, and the variable node information of the kth iteration may be represented as $v_k=g(c_k)$. When combining these two operations together, the following notation may be employed: $v_k=g(f(v_{k-1}))$. For a more concise representation, a new function may be defined as follows: $F(x)=g(f(x))$. In addition, it can be seen that the current iteration's information of a variable node is a function of the previous iteration's information of the variable node; this may be represented mathematically as follows: $v_k=F(v_{k-1})$.

As criteria for determining when the decoding operation is in fact converging on a solution, the comparison of a current iteration's information of a variable node with the previous iteration's information of that variable node may be made. For example, when $v_k=v_{k-1}$, then the decoding processing may be viewed as having converged on a fixed point solution such that $v=v_k$ (which may also be represented as $v=F(v)$). When this criterion has in fact been met, then the final value of $v$ will be the final output of the SP decoding approach. The following figure shows one view of this decoding processing converging on a solution.

Figure 11:
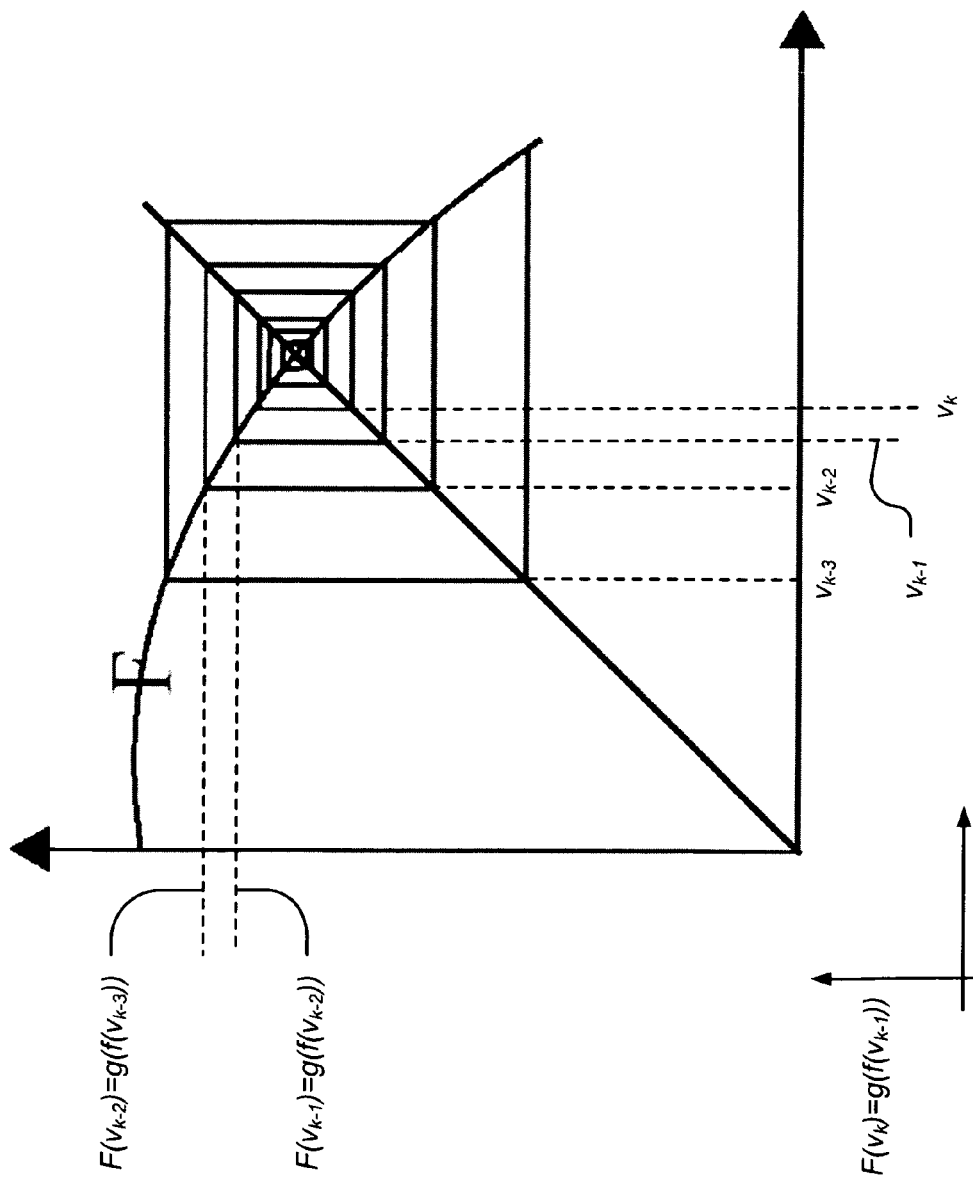
FIG. 11 is a diagram illustrating a 2-dimensional fixed point animation of decoding Low Density Parity Check (LDPC) code according to the invention.

FIG. 11 is a diagram illustrating a 2-dimensional fixed point animation of decoding Low Density Parity Check (LDPC) code according to the invention. Ideally, as shown in this illustration, the difference between a current iteration's value and the previous iteration's value will continue to decrease as the total number of iterations increases. If this is the case, then the decoding processing will in fact converge on a solution.

When operating within communication systems that support higher Signal to Noise Ratios (SNRs), this decoding approach may converge to a fixed point when decoding all blocks. For example, when considering the illustrative LDPC code described above (having a rate 0.9446 regular LDPC code of block size 9198 and $(d_v,d_c)=(4,72)$), when operating using a SNR of $E_b/N_o=5.6$ dB and with 20 Million blocks being simulated, it was found that the decoding functionality of the FIG. 10 converges to the correct fixed point for all of those blocks. Although a majority of those blocks only needed between 3 and 5 iterations to converge on the fixed point solution, there were nevertheless many blocks that needed more than 100 iterations. Clearly, such a requirement of supporting a very high number of decoding iterations may not be practical for many applications. In fact, the slowly converging blocks caused the decoding functionality to oscillate between a small number of bits errors to a larger number of bits errors. The following figure illustrates this effect.

FIG. 12 is a diagram illustrating an example of oscillations caused when decoding a Low Density Parity Check (LDPC) coded block (last 100s of iterations are shown). The previous 100s of iterations undergo similar oscillations as shown in the left hand side of the graph. In this example, before the $4334^{th}$ iteration, which is also convergence iteration, the decoder oscillated from between 5 bits errors to more than 4000 bits errors during the decoding processing.

When operating at SNR mentioned above, when $E_b/N_o=5.6$ dB, among the 4 million blocks, there are 10 blocks that will cause oscillations during the decoding processing. When the SNR improves a bit, at $E_b/N_o=5.8$ dB, then among 20 Million blocks, there are only 5 blocks causing oscillations during the decoding processing.

Several of the following figures illustrate various embodiments of the invention that employ Bit-Flip (BF) hard decision decoding. In this context of LDPC decoding processing described herein, a brief description of BF hard decision decoding is provided here from the following source: Yu Kou, Shu Lin, and Marc P. C. Fossorier, "Low-Density Parity-Check Codes Based on Finite Geometries: A Rediscovery and New Results," *IEEE Trans. Inform. Theory*, Vol. 47, No. 7, pp. 2711-2736, November 2001.

"BF decoding of LDPC codes was devised by Gallagher in the early 1960s [R. G. Gallager, "Low density parity check codes," *IRE Trans. Inform. Theory*, vol. IT-8, pp. 21-28, January 1962], [R. Gallager, *Low-Density Parity-Check Codes*, Cambridge, Mass.: MIT Press, 1963]. When detectable errors occur during the transmission, there will be parity failures in the syndrome $s=(s_1, s_2, \ldots, s_J)$ and some of the syndrome bits are equal to 1. BF decoding is based on the change of the number of parity failures in $\{z \cdot h_j: 1 \leq j \leq J\}$ when a bit in the received sequence z is changed.

First, the decoder computes all the parity-check sums based on $$s_j = z \cdot h_j = \sum_{l=0}^{n-1} z_l h_{j,l}$$

and then changes any bit in the received vector z that is contained in more than some fixed number $\delta$ of un-satisfied parity-checks equations. Using these new values, the parity-check sums are recomputed, and the process is repeated until the parity-check equations are all satisfied. This decoding is an iterative decoding algorithm. The parameter $\delta$, called threshold, is a design parameter which should be chosen to optimize the error performance while minimizing the number of computations of parity-check sums. The value of $\delta$ depends on the [LDPC] code parameters $\rho$ [number of points in every line of finite geometry with n points and J lines], $\gamma$ [number of lines that intersect point of finite geometry with n points and J lines], $d_{min}$ [minimum distance of the LDPC code] and the signal-to-noise ratio (SNR).

If decoding fails for a given value of $\delta$, then the value of $\delta$ can be reduced to allow further decoding iterations. For error patterns with number of error less than or equal to the error correcting capability of the code, the decoding will be complete in one or a few iterations. Otherwise, more decoding iterations are needed. Therefore, the number of decoding iterations is a random variable and is a function of the channel SNR. A limit may be set on the number of iterations. When this limit is reached, the decoding process is terminated to avoid excessive computations. Due to the nature of LDPCs, the above decoding algorithm corrects many error patterns with number of errors exceeding the error correcting capability of the code.

A very simple BF decoding algorithm is given as follows:
Step 1 Compute the parity-check sums (syndrome bits). If all parity-check equations are satisfied (i.e., all the syndrome bits are zero), stop the decoding.
Step 2 Find the number of unsatisfied parity-check equations for each code bit position, $f_i$, i=0,1, ..., n−1.
Step 3 Identify the set $\Omega$ of bits for which $f_i$ is the largest.
Step 4 Flip the bits in the set $\Omega$.
Step 5 Repeat Steps 1) to 4) until all parity-check equations are satisfied (for this case, we stop the iteration in Step 1) or a predefined maximum number of iterations is needed.

BP decoding requires only logical operations. The number of logical operations $N_{BF}$ performed for each decoding iteration is linearly proportional to $J\rho$ (or $n\gamma$), say, $N_{BF}=K_{BF}J\rho$, where the constant $K_{BF}$ depends on the BF decoding algorithm. Typically, $K_{BF}$ is less than three. The simple BF decoding algorithm can be improved by using adaptive thresholds of δ's. Of course, this improvement is achieved at the expense of more computations. EG [Euclidean geometries]- and PG [Partial Geometry]-LDPC codes perform well with the BF decoding due to the large number of check sums orthogonal on each code bit." Yu Kou, Shu Lin, and Marc P. C. Fossorier, "Low-Density Parity-Check Codes Based on Finite Geometries: A Rediscovery and New Results," *IEEE Trans. Inform. Theory*, Vol. 47, No. 7, pp. 2718, November 2001.

Figure 13A:
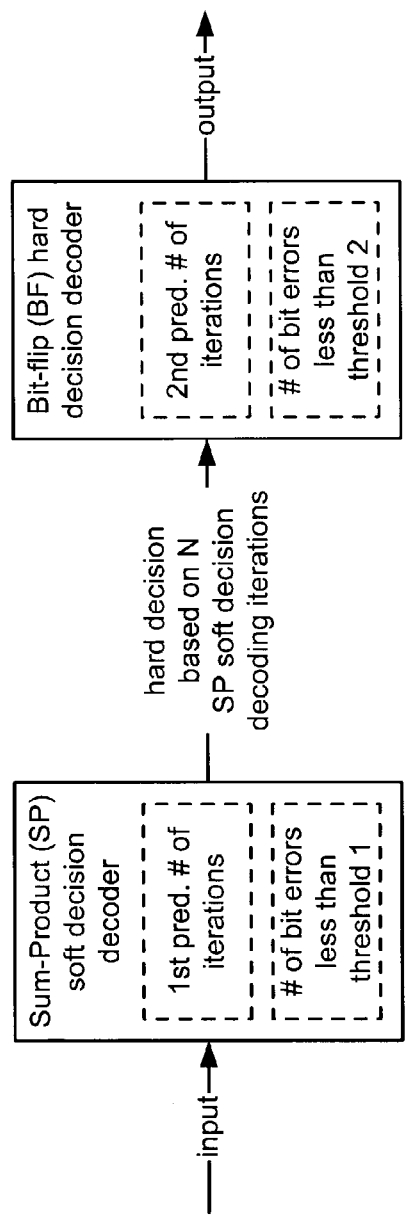
FIG. 13A is a diagram illustrating an embodiment of decoding that combines Sum-Product (SP) soft decision decoding and Bit-Flip (BF) hard decision decoding according to the invention.

FIG. 13A is a diagram illustrating an embodiment of decoding that combines Sum-Product (SP) soft decision decoding and Bit-Flip (BF) hard decision decoding according to the invention. This embodiment shows functionality supporting the novel combination of performing SP soft decision decoding and BF hard decision decoding within a single decoder design. An input signal is provided to an SP soft decision decoder that may be implemented in any number of different ways. For example, the SP soft decision decoder may perform a predetermined number of soft decision decoding iteration; alternatively, the SP soft decision decoder may perform soft decision decoding until a total number of bit errors is less than a threshold. This threshold may be determined based on simulations or training that is performed offline under similar conditions. Using the appropriate number of SP soft decision decoding iterations, based on the threshold that is determined offline using simulations or training, then an acceptable number of bit errors should then be expected. This predetermined number of soft decision decoding iterations and threshold employed by the SP soft decision decoder may be viewed as being a first predetermined number of iterations and a first threshold.

Afterwards, after the SP soft decision decoder has performed all of its soft decision decoding iterations, then a preliminary hard decision is made on those final soft decision decoding results before passing those hard decisions to a BF hard decision decoder. Analogous to the SP soft decision decoder, the BF hard decision decoder may be implemented in any number of different ways. For example, the BF hard decision decoder may perform a predetermined number of hard decision decoding iteration; alternatively, the BF hard decision decoder may perform hard decision decoding until a total number of bit errors is less than a threshold. Similar to the SP soft decision decoding above, with respect to the BF hard decision decoding here, this threshold may be determined based on simulations or training that is performed offline under similar conditions. Using the appropriate number of BF hard decision decoding iterations, based on the threshold that is determined offline using simulations or training, then an acceptable number of bit errors should then be expected.

This predetermined number of hard decision decoding iterations and threshold employed by the BF hard decision decoder may be viewed as being a second predetermined number of iterations and a second threshold. The final output of the BF hard decision decoder is then a best estimate of the signal received by the SP soft decision decoder. This output may be viewed as being an estimate of a codeword within the signal received by the SP soft decision decoder.

The total number of iterations performed by the SP soft decision decoder and the BF hard decision decoder may also be intelligently made as to optimize performance. For example, a determination of the first predetermined number of iterations (of soft decision decoding iterations made by the SP soft decision decoder) and the second number of iterations (of hard decision decoding made by the BF hard decision decoder) may be made cooperatively so as to optimize the performance of the total functionality of the decoder.

Figure 13B:
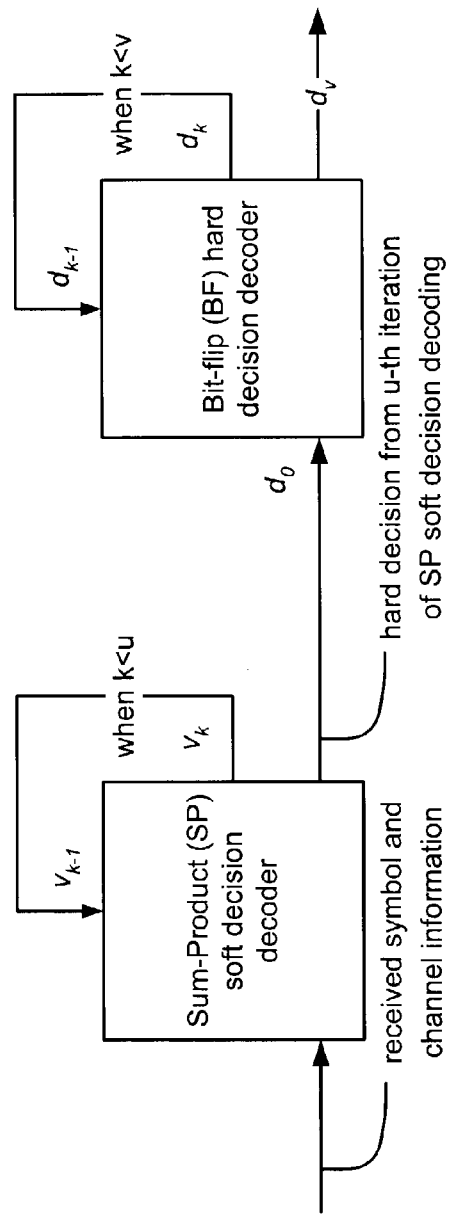
FIG. 13B is a diagram illustrating another embodiment of decoding that combines Sum-Product (SP) soft decision decoding and Bit-Flip (BF) hard decision decoding according to the invention.

FIG. 13B is a diagram illustrating another embodiment of decoding that combines Sum-Product (SP) soft decision decoding and Bit-Flip (BF) hard decision decoding according to the invention. This embodiment shows one particular embodiment of how the combination of SP soft decision decoding and BF hard decision decoding may be implemented. For example, a received signal and communication channel information (corresponding to the communication channel over which the received symbol has been communicated) is first received by a SP soft decision decoder. This SP soft decision decoder performs decoding using a number of soft decision decoding iterations, shown as being u iterations. Then, a hard decision that is generated from the last iteration of soft decision decoding (performed by the SP soft decision decoder) is passed on to a BF hard decision decoder that performs a number of hard decision decoding iterations before outputting a final best estimate of the received symbol that is initially received by the SP soft decision decoder.

This functionality may be implemented such that the soft decision decoding iterations performed by the SP soft decision decoder are ended before the SP soft decision decoder oscillates. For example, when the total number of soft decision decoding iterations is kept within the range of approximately 4 to 6, then the SP soft decision decoder is found not to oscillate. Therefore, the total number of soft decision decoding iterations may be kept at approximately 5 or 6 iterations. Typically, at this point, the soft decision decoding will include very few bit errors (say in the range of 1 to 3 bit errors). This is where the functionality of the BF hard decision decoder may come into place. The use of the BF hard decision decoder may then be used to eliminate these few remaining bit errors. In most instances, 2 additional hard decision decoding iterations performed by the BF hard decision decoder will eliminate these remaining bit errors that exist in the hard decisions provided to the BF hard decision decoder by the SP soft decision decoder (those hard decisions based on the soft decision decoding decisions provided by the SP soft decision decoder).

When performing simulations using 4 million blocks with 6 soft decision decoding iterations performed by the SP soft decision decoder and 2 hard decision decoding iterations performed by the BF hard decision decoder, at a SNR of $E_b/N_o$=5.6 dB, then it is found that only 10 block do not converge to a proper estimate of the codeword received by the SP soft decision decoder. In addition, all of the non-converging blocks have very few remaining bit errors. Specifically, the total number of bit errors is less than 10 for each of these non-converging blocks. Overall, the bit error is then found to be 1.38121547e-09. When simulating 13 million blocks, the simulation performed using simulation at an SNR of $E_b/N_o$=5.8 dB, it is found that only 3 of those blocks do not converge. Overall, during this simulation, the bit error rate is reduced nearly an order of magnitude to 1.50517070e-10.

However, while this combination approach does provide a significant reduction in complexity and a greater improvement in performance over the prior art approaches, additional measures can be made to increase the performance to an even greater degree. To achieve a lower bit error rate, being less than 1.0e-15, the decoder should be allowed to converge almost all of the blocks within an acceptable number of iterations. Two additional approaches are presented to reduce the longer oscillations even further.

Figure 14:
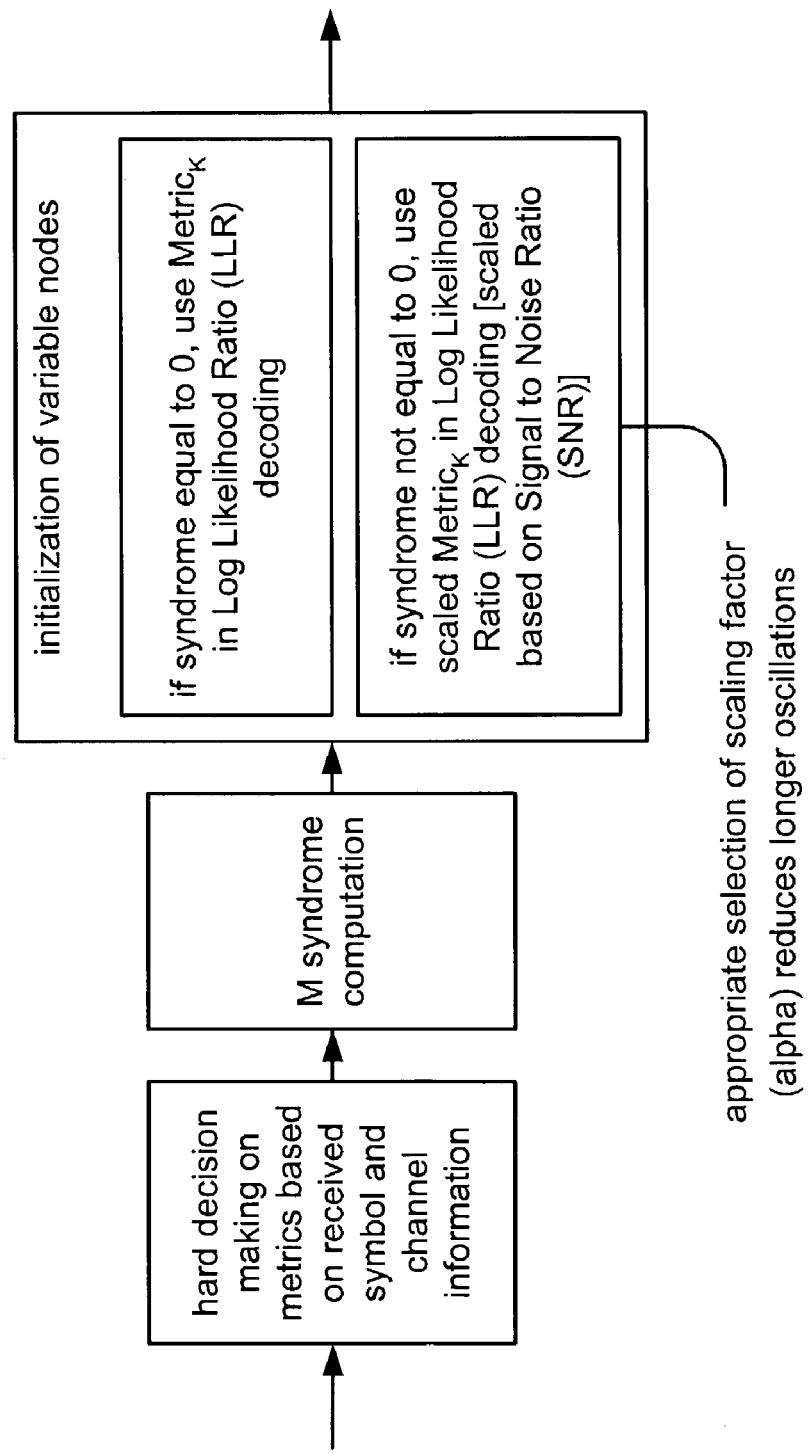
FIG. 14 is a diagram illustrating an embodiment of modified Sum-Product (SP) soft decision decoding initialization that is performed according to the invention.

FIG. 14 is a diagram illustrating an embodiment of modified Sum-Product (SP) soft decision decoding initialization that is performed according to the invention. In the prior art approaches to perform SP soft decision decoding, the variable nodes $v_0$, are typically initialized to a metric that is based on the received symbol and the channel information corresponding to the communication channel over which the received symbol is communicated.

As an example, with an Additive Gaussian White Noise (AGWN) communication channel of variance, $\sigma$, then the logarithm of the metric may be identified as follows:

$$\text{metric}_i(0) = \frac{-1}{2\sigma^2}(y_i - \sqrt{E})^2 \quad (EQ\ 1)$$

$$\text{metric}_i(1) = \frac{-1}{2\sigma^2}(y_i + \sqrt{E})^2$$

where E is the energy of a bit signal and $y_i$ is a received signal. In the Log Likelihood Ratio (LLR) decoding approach, then the metric may be represented as follows:

$$\text{metric}_i = \frac{2}{\sigma^2} y_i$$

However, the invention may be implemented differently using a new manner of how to modify the hard decisions made on these metrics. Since every variable node, $v_i$, has $d_v$ edges connecting to some of the corresponding check nodes. These check nodes are denoted as follows:

$$c(v_i, 0), \ldots, c(v_i, d_{v-1})$$

The hard decisions made on the metrics are initially categorized as follows:

$$a_i = \begin{cases} 0, & \text{metric}(0) > \text{metric}(1) \\ 1, & \text{otherwise} \end{cases}$$

Afterwards, the several syndromes corresponding to the various scenarios are calculates within an M syndrome computation functional block as follows:

The syndromes $S_{c_0}, S_{c_1}, \ldots, S_{c_{M-1}}$ are calculated, using the hard decisions made above $\alpha_0, \ldots, \alpha_{N-1}$. Therefore, each of the syndromes may then be represented as follows:

$$S_{c_1} = (a_0, \ldots, a_{N-1})h_i^T, \text{ where } H = \begin{pmatrix} h_0 \\ \cdots \\ h_{M-1} \end{pmatrix}$$

is the parity check matrix. The variable node information, $v_i$, may then be initialized within an initialization of variable nodes functional block as follows:

If $S_{c(v_i, j)}$=0, then the edge of $(v_i, c(v_i, j))$ is initialized with the Metric$_k$(0), Metric$_k$(1) (or Metric$_K$ in LLR decoder).

Alternatively, if $S_{c(v_i, j)} \neq 0$, then the edge of $(v_i, c(v_i, j))$ is initialized with a scaling factor to produce scaled metrics, shown as $\alpha$·Metric$_k$(0), $\alpha$·Metric$_k$(1) (or $\sigma$·Metric$_k$ in LLR decoding), where $\alpha$ is a constant value that depends on the SNR of the communication channel. The scaling value of a may be appropriately selected based on the SNR to reduce any longer oscillations that may undesirably occur within an SP soft decision decoder implemented according to the invention.

Figure 15:
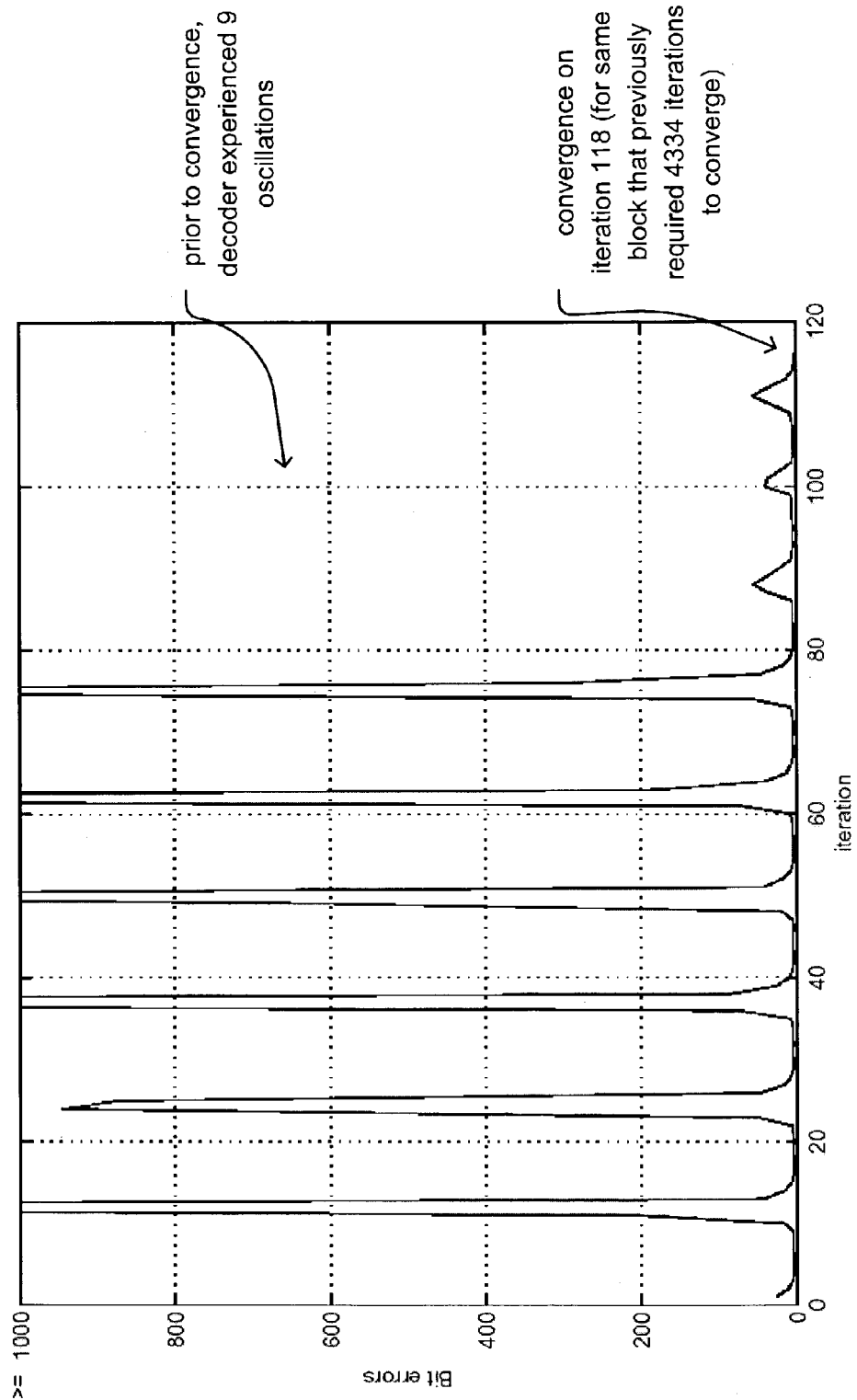
FIG. 15 is a diagram illustrating an example of shortened oscillations that are achieved using modified Sum-Product (SP) soft decision decoding initialization according to the invention.

FIG. 15 is a diagram illustrating an example of shortened oscillations that are achieved using modified Sum-Product (SP) soft decision decoding initialization according to the invention. As mentioned above, by appropriately choosing the scaling actor, $\alpha$, to be used to scale the metrics, the longer oscillations may be reduced and/or eliminated completely.

For example, when operating at a SNR of $E_b/N_o$=5.6 dB, all of the 10 oscillating blocks mentioned above within the 4 millions blocks converge within fewer than 20 total decoding iterations thereby providing an even greater improvement in performance when compared to the other embodiments described above. Moreover, for the problematic block described above that converged only at the 4334$^{th}$ iteration, when the modified SP soft decision decoding initialization presented above is employed, then only 118 iterations are needed to converge on the appropriate codeword. In fact, the decoder oscillates a mere 9 times as shown within the figure when compared to the large number of oscillations shown above in the embodiment not employing this initialization approach 1.

There are at least two approaches shown herein that may benefit from the initialization presented above. Two of the possible approaches performed according to the invention are presented below as approach 1 and approach 2. These 2 new approaches of performing the initialization of decoding help avoid the larger numbers of bit errors that may occur when decoding some blocks for which the decoder still oscillates after a given number of iterations.

Figure 16:
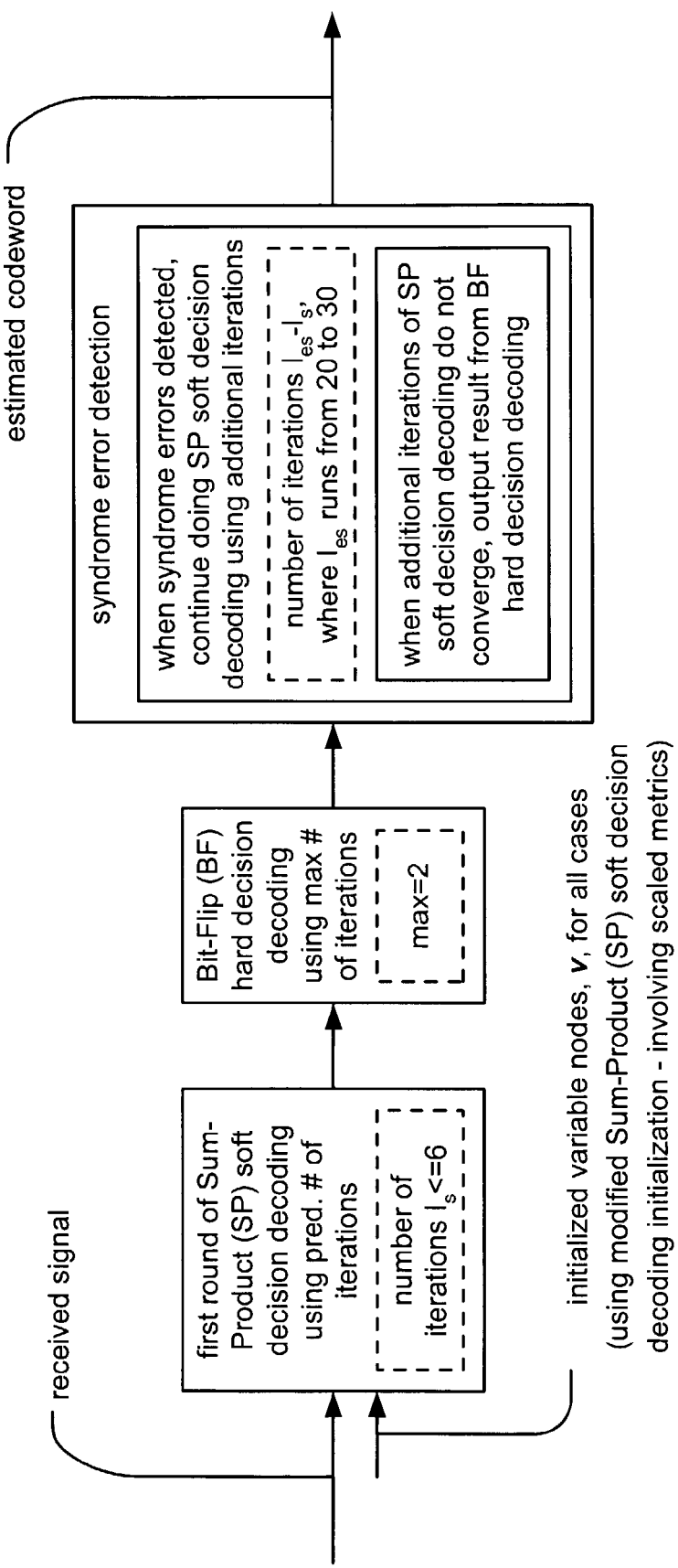
FIG. 16 is a diagram illustrating an embodiment of decoding processing (approach 1) that capitalizes on improved initialization according to the invention.

FIG. 16 is a diagram illustrating an embodiment of decoding processing (approach 1) that capitalizes on improved initialization according to the invention. The functionality shown within this figure employs the modified initialization of the metrics based on the scaling factor, $\alpha$, that may be selected based on the SNR of the communication channel as described above. The metrics are appropriately, selectively scaled (to generate the scaled metrics) to reduce the possibility of having longer oscillations during the decoding processing.

Firstly, the variable nodes, $v$, are initialized for all of the possible cases. A received signal undergoes a first round of soft decision decoding iterations within an SP soft decision decoder. As shown within this embodiment, the total number of soft decision decoding iterations, $I_s$, is less than or equal to 6, e.g., $I_s \leq 6$. After the soft decision decoding is performed by the SP soft decision decoder, then no more than 2 hard decision decoding iterations are performed by the BF hard decision decoder, e.g., a max number of hard decision decoding iterations of 2.

Afterwards, a syndrome error detection functional block determines whether or not there are still bit errors within the decoded data. For example, if the syndrome error detection functional block detects a bit error after the hard decision decoding performed by the BF hard decision decoder, then the SP soft decision decoder will continue to perform soft decision decoding with additional soft decision decoding iterations. These additional soft decision decoding iterations, $I_{es}$, may vary in range from $I_{es}$-$I_s$, where $I_{es}$ may run from 20 to 30. After the additional soft decision decoding iterations are performed, if it is determined that the additional soft decision decoding of the SP soft decision decoder does not converge, as determined by the syndrome error detection functional block, then the output of the BF hard decision decoder is selected as the decoder output and as being the best estimate of the codeword that is included within the received signal originally received by the SP soft decision decoder.

It is also noted here, however, that, when using this new approach to initialization, there may be more be blocks that need extended soft decision decoding by the SP soft decision decoder than are required by the originally presented approach.

Figure 17:
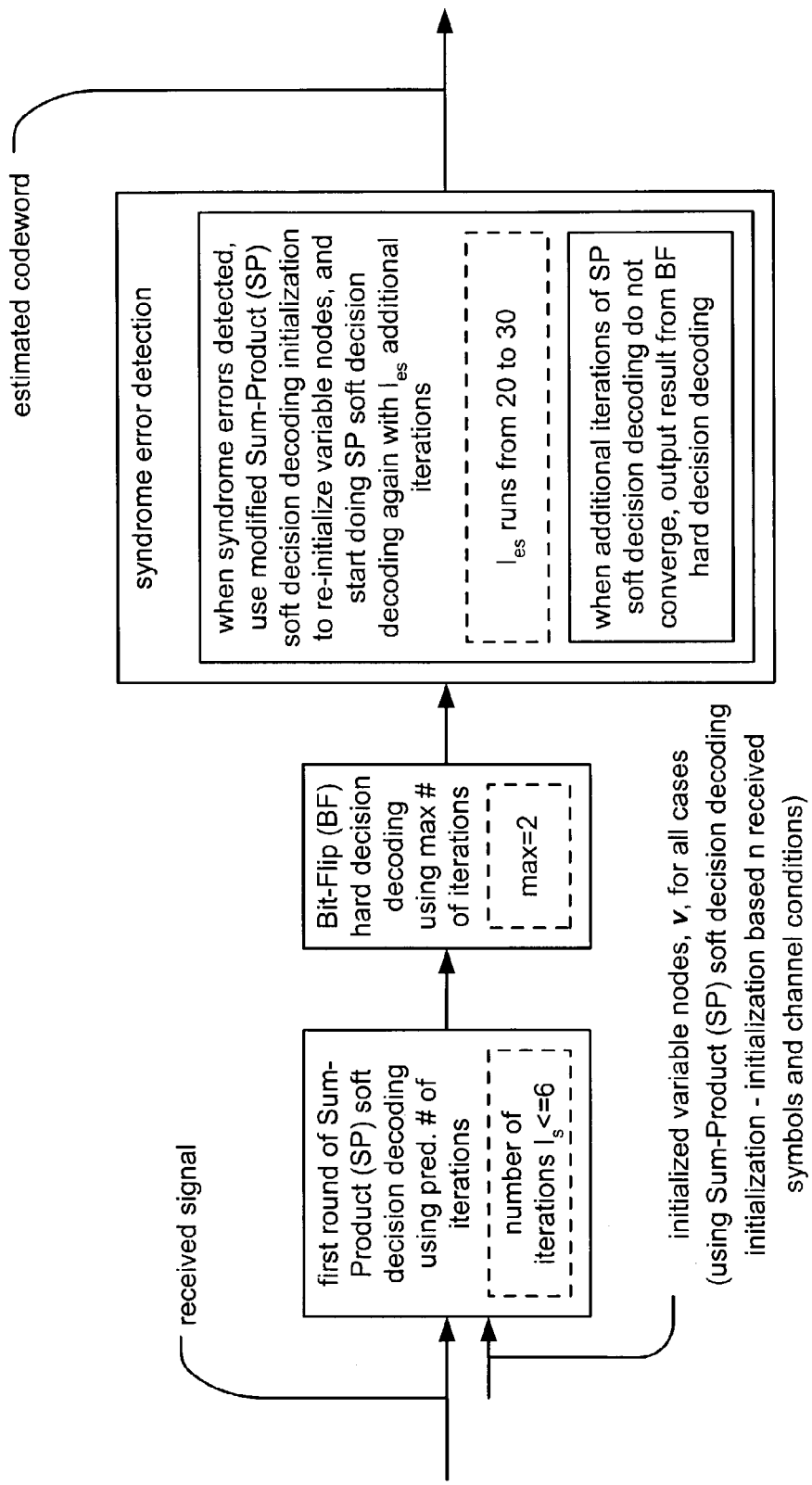
FIG. 17 is a diagram illustrating another embodiment of decoding processing (approach 2) that capitalizes on improved initialization according to the invention.

FIG. 17 is a diagram illustrating another embodiment of decoding processing (approach 2) that capitalizes on improved initialization according to the invention. The functionality shown within this figure employs the SP soft decision decoding initialization of the metrics as performed within the LLR decoding approach for LDPC codes as described above. This is based on the SNR of the communication channel as described above without performing the appropriate, selective scaling that is also described above.

Firstly within this embodiment, the variable nodes, v, are initialized for all of the possible cases using the LLR decoding approach for LDPC codes as described above. A received signal undergoes a first round of soft decision decoding iterations within an SP soft decision decoder. As shown within this embodiment, the total number of soft decision decoding iterations, $I_s$, is less than or equal to 6, e.g., $I_s \leq 6$. After the soft decision decoding is performed by the SP soft decision decoder, then no more than 2 hard decision decoding iterations are performed by the BF hard decision decoder, e.g., a max number of hard decision decoding iterations of 2.

Afterwards, a syndrome error detection functional block determines whether or not there are still bit errors within the decoded data. For example, if the syndrome error detection functional block detects a error after the hard decision decoding performed by the BF hard decision decoder, then the variable nodes, v, are re-initialized for all of the possible cases using the LLR decoding approach for LDPC codes as described above. Thereafter, the SP soft decision decoding begins again (starting with these re-initialization values for the variable nodes, v. Additional SP soft decision decoding iterations are performed for $I_{es}$ iterations.

These additional soft decision decoding iterations, $I_{es}$, may vary in range from $I_{es}$-$I_s$, where $I_{es}$ may run from 20 to 30. Moreover, after the additional soft decision decoding iterations are performed, if it is determined that the additional soft decision decoding of the SP soft decision decoder does not converge, as determined by the syndrome error detection functional block, then the output of the BF hard decision decoder is selected as the decoder output and as being the best estimate of the codeword that is included within the received signal originally received by the SP soft decision decoder.

Figure 18:
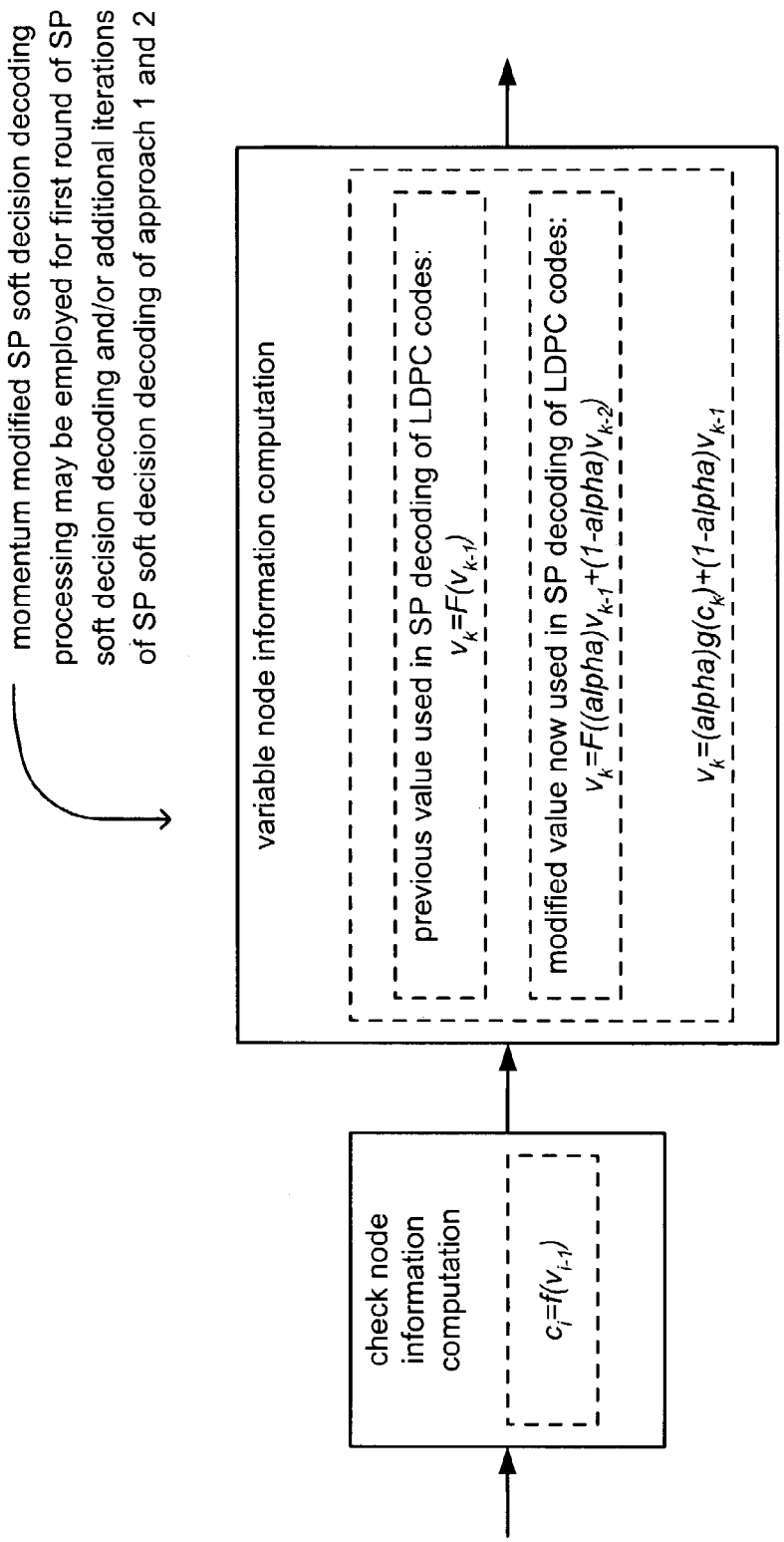
FIG. 18 is a diagram illustrating an embodiment of momentum modified Sum-Product (SP) soft decision decoding processing that is updated using the previous 2 iterations according to the invention.

FIG. 18 is a diagram illustrating an embodiment of momentum modified Sum-Product (SP) soft decision decoding processing that is updated using the previous 2 iterations according to the invention. Rather than performing updating of the current iteration using only the previous iterations resultant values, the previous 2 iteration values are used to perform the updating. Specifically, this results in a momentum modified SP soft decision decoding processing that capitalizes on the results of these 2 previous iterations to provide for even improved decoding processing.

Initially, a check node information computation functional block performs initial calculation of the check node information. The check node information of the kth iteration may be represented as $c_k = f(v_{k-1})$. Afterwards a variable node information computation functional block performs calculation of the variable node information.

In Kevin P. Murphy, Yair Weiss, Michael I. Jordan, "Loopy belief propagation for approximate inference: an empirical study," in *Proc. Uncertainty in Artificial Intelligence, 1999,*" a proposition of using "momentum" to fix oscillations in the QME-DT network is introduced. However, here, a momentum modification is alternatively employed and applied specifically to reduce and/or eliminate oscillations that may occur when decoding LDPC coded signals.

The previous variable node values used in performing SP soft decision decoding of LDPC codes would have been as shown below:

$$v_k = F(v_{k-1})$$

However, in contradistinction, here, the modified variable node values used in performing SP soft decision decoding of LDPC codes is now replaced as shown below:

$$v_k = F(\alpha v_{k-1} + (1-\alpha) v_{k-2})$$

Using this improved, momentum modified variable node information based on the previous 2 iterations, as well as using the appropriate selected scaling value of α (alpha) based on the considerations described above, the decoding processing is found to converge on a solution using a much fewer number of oscillations.

It is also noted that this momentum modified approach to calculating the variable node information may be implemented within either one or both of the approaches 1 and/or 2 described above that capitalizes on the improved initialization.

Figure 19:
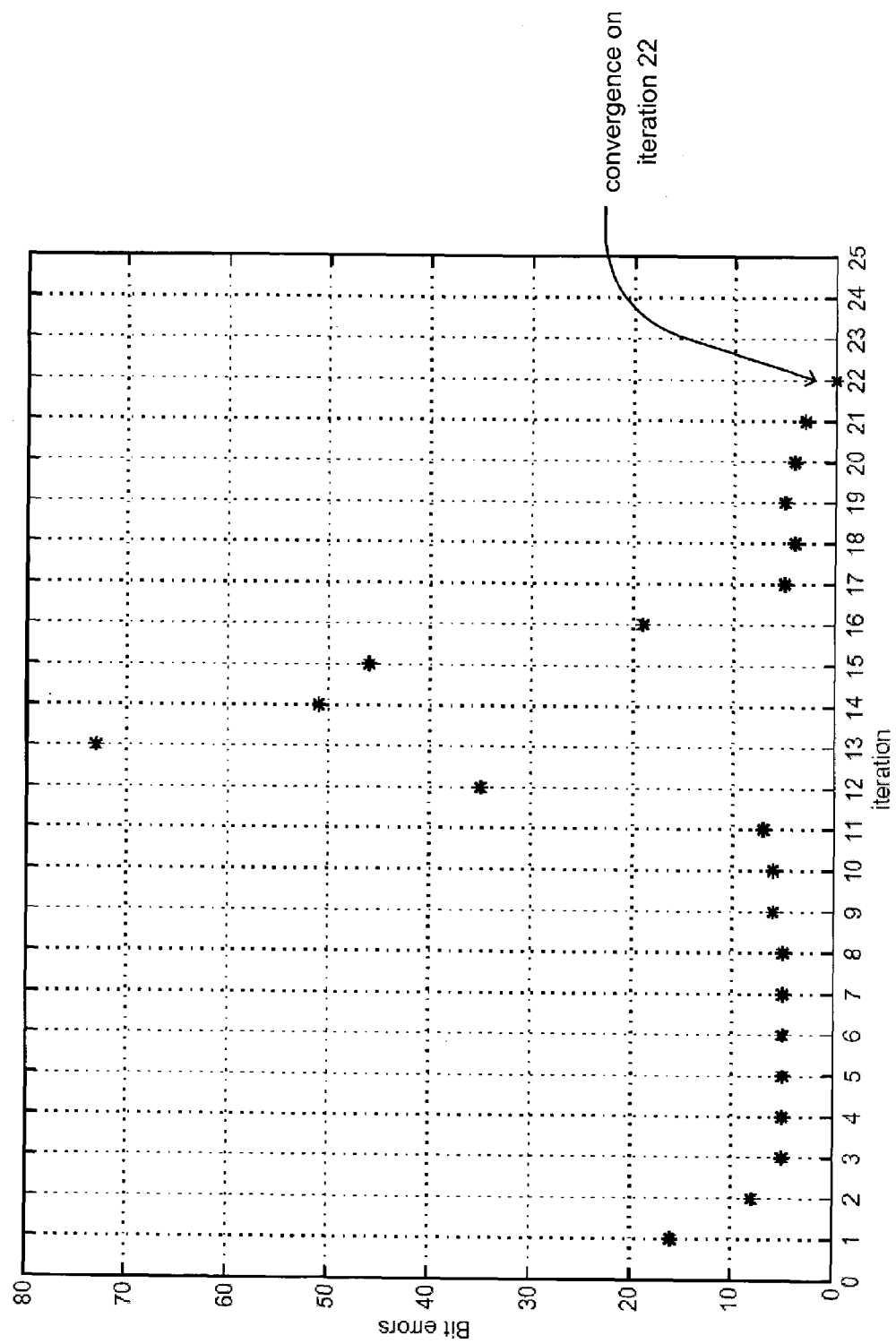
FIG. 19 is a diagram illustrating an example of shortened oscillations that are achieved using momentum modified Sum-Product (SP) soft decision decoding processing according to the invention.

FIG. 19 is a diagram illustrating an example of shortened oscillations that are achieved using momentum modified Sum-Product (SP) soft decision decoding processing according to the invention. Using the momentum modified SP soft decision decoding processing approach described above, and with the appropriately selected constant scaling value of α (alpha), the decoding processing converges on the appropriate codeword using only 22 iterations when α (alpha)=0.7.

It is also noted here that if the hardware of a decoder that performs the decoding processing described herein is implemented such that the memory for both "check" information values and "variable" information values is shared for both of these information values, then the "momentum" modified SP soft decision decoding approach may need additional memory for the previous "variable" information values. However, if the memory for "check" information values and the "variable" information values is implemented in a non-shared manner, then this approach will not require any additional memory whatsoever.

Using this new and improved decoding approach, and being simulated at an SNR of 5.8 dB, the decoding processing is operable to decode more than 20 million blocks with no errors. The decoding processing is operable to decode all 20 million blocks where no error is found.

Figure 20:
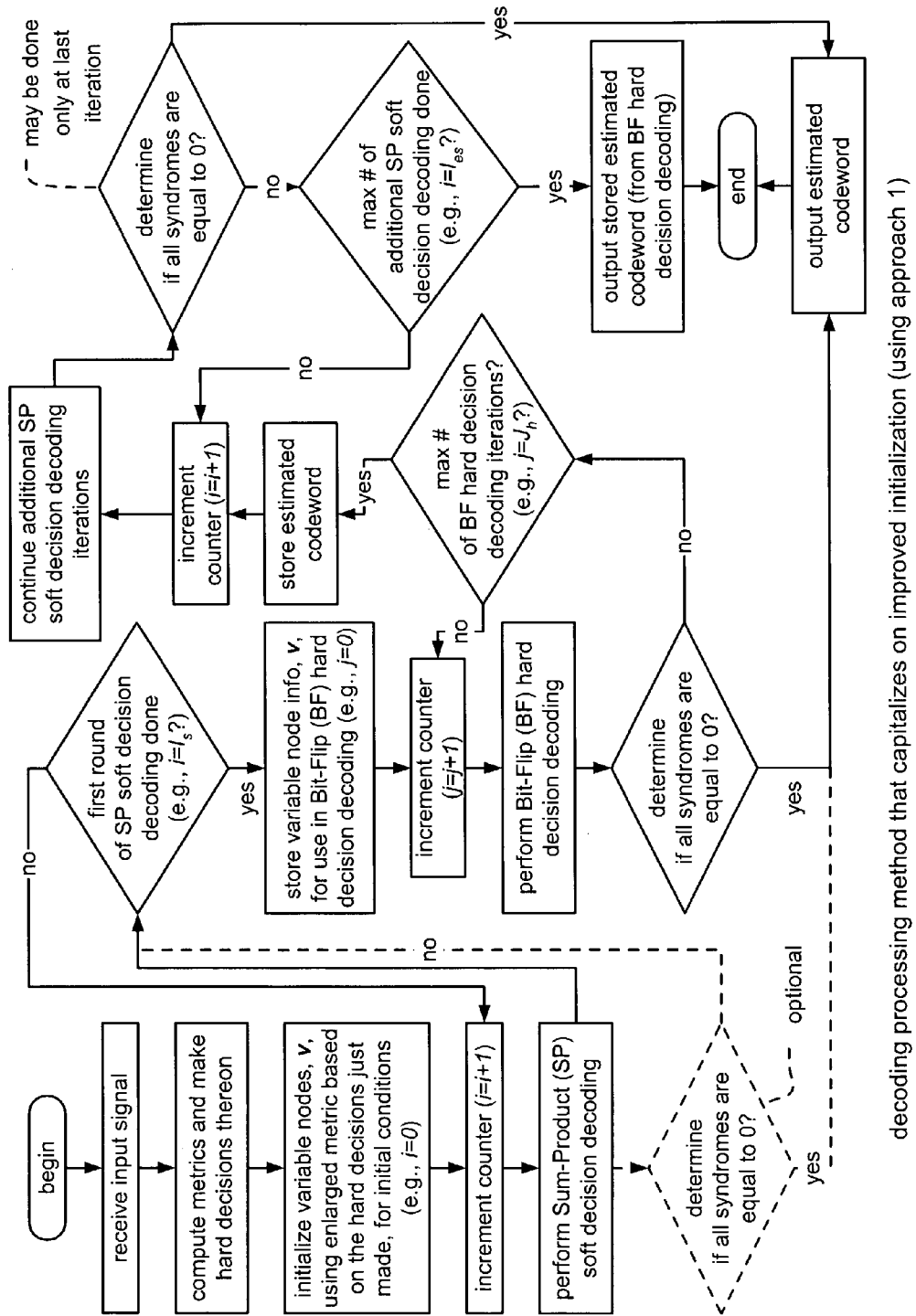
FIG. 20 is a flowchart illustrating an embodiment of a decoding processing method that capitalizes on improved initialization (using approach 1).

FIG. 20 is a flowchart illustrating an embodiment of a decoding processing method that capitalizes on improved initialization (using approach 1). An input signal is initially received. Then, metrics of the received signal are computed and hard decisions are made thereon.

Using these hard decisions, the variable nodes, v, are initialized using the enlarged metrics (sometimes referred to as scaled metrics) based on the hard decisions made above based on the metrics of the received signal. This may be viewed as being for the initial conditions, e.g., i=0 for the variable nodes, v. Afterwards, an SP soft decision decoding counter i is incremented as shown for i=i+1. Using this SP soft decision decoding counter, i, SP soft decision decoding is then performed.

If desired in some embodiments, it is then determined if all of the possible syndromes are then equal to zero in an optional decision block. This process need not necessarily be performed at this point in all embodiments. If all of the syndromes are in fact equal to zero, then the method has converged, and the method may then output the estimated codeword. Alternatively, if all of the syndromes are not equal to zero, then the method has not yet converged, and the method will continue performing SP soft decision decoding until all of the SP soft decision decoding iterations of the first round of SP soft decision decoding have been completed.

During the first round of SP soft decision decoding iterations, this may be shown as determining if the counter has reached a maximum number of SP soft decision decoding iterations $I_s$, e.g., if $i=I_s$. If the final iteration of SP soft decision decoding has not yet been completed, then the SP soft decision decoding counter i is again incremented as shown for i=i+1, and the next iteration of the SP soft decision decoding is performed within the first round of SP soft decision decoding. If the final iteration of SP soft decision decoding has in fact been completed, then the method will store the variable node information, v, for subsequent use in BF hard decision decoding. This initial variable node information, v, is used as the initial condition, j=0, for the BF hard decision decoding. A BF hard decision decoding counter, j, is then incremented as shown for j=j+1, and the BF hard decision decoding is then performed using that counter.

At this point, it may then be determined if all of the syndromes are equal to zero. If all of the syndromes are in fact equal to zero, then the method has converged, and the method may then output the estimated codeword at this point after performing at least one iteration of BF hard decision decoding. Alternatively, if all of the syndromes are not equal to zero, then the method has not yet converged, and the method will continue to perform BF hard decision decoding until the method reaches a maximum number of BF hard decision decoding iterations $J_h$, e.g., if $j=J_h$. If the BF hard decision decoding has not yet reached the final BF hard decision decoding iteration, then the method will increment the BF hard decision decoding counter as shown for j=j+1.

When the BF hard decision decoding has in fact reached the final BF hard decision decoding iteration, then the method will store the estimated codeword at this point, and the SP soft decision decoding counter will then be incremented (based from its previous, final value in the first round of SP soft decision decoding) as shown for i=i+1, and the method will continue to perform additional SP soft decision decoding iterations. At this point, it will then again be determined of all of the syndromes are equal to zero. It is noted that this determination of whether the syndromes are all equal to zero may be performed at a last iteration of the additional SP soft decision decoding iterations. If all of the syndromes are in fact equal to zero, then the method has converged, and the method may then output the estimated codeword. However, if the all of the syndromes are not yet equal to zero, the method will continue to perform additional SP soft decision decoding iterations until a maximum number of additional SP soft decision decoding iterations have been performed, as shown by $I_{es}$, e.g., if $i=I_{es}$.

Thereafter, if all of these additional SP soft decision decoding iterations have not in fact been performed, then the method will increment the SP soft decision decoding counter as shown for i=i+1, and the method will continue to perform additional SP soft decision decoding iterations until the maximum number of additional SP soft decision decoding iterations have been performed as described above. Clearly, when the final SP soft decision decoding iteration of the additional SP soft decision decoding iterations has been reached, then the determination of whether all of the syndromes are equal to zero may then be made. When the maximum number of additional SP soft decision decoding iterations have in fact been performed, and if all of the syndromes are not equal to zero, then the method will output the previously stored, estimated codeword generated by the BF hard decision decoding.

Figure 21:
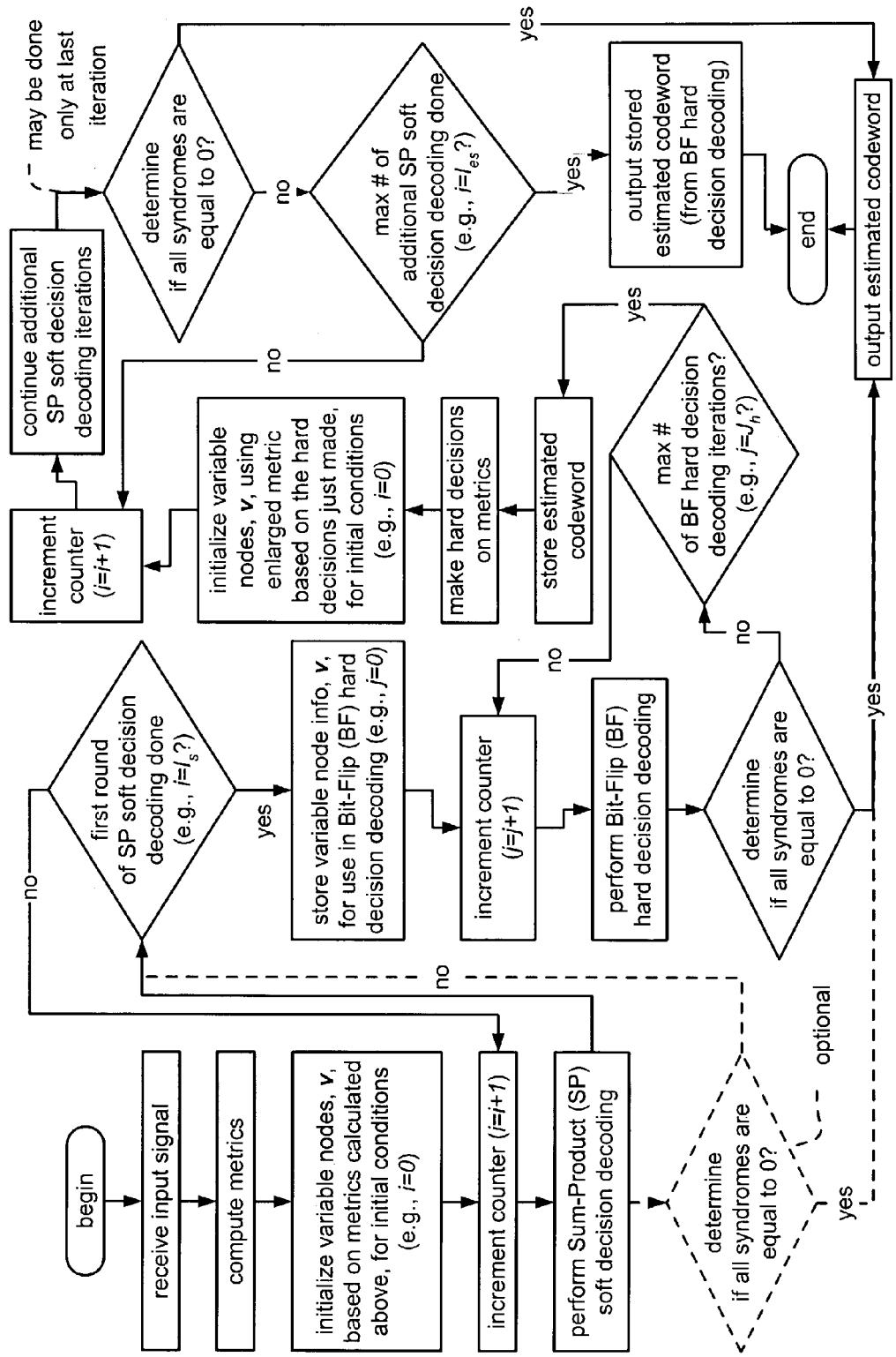
FIG. 21 is a flowchart illustrating another embodiment of a decoding processing method that capitalizes on improved initialization (using approach 2).

FIG. 21 is a flowchart illustrating another embodiment of a decoding processing method that capitalizes on improved initialization (using approach 2). Several aspects of this approach 2 are somewhat similar to the approach 1 of the previous method; however, there are certain differences that do provide for improved performance in some embodiments.

An input signal is initially received. Then, metrics of the received signal are thereafter computed. The variable nodes, v, are then initialized using these calculated metrics; it is noted that (at this point) these are not the scaled metrics referred to above in other embodiments. This may be viewed as being for the initial conditions, e.g., i=0 for the variable nodes, v. Afterwards, an SP soft decision decoding counter i is incremented as shown for i=i+1. Using this SP soft decision decoding counter, i, SP soft decision decoding is then performed.

If desired in some embodiments, it is then determined if all of the possible syndromes are then equal to zero in an optional decision block. This process need not necessarily be performed at this point in all embodiments. If all of the syndromes are in fact equal to zero, then the method has converged, and the method may then output the estimated codeword. Alternatively, if all of the syndromes are not equal to zero, then the method has not yet converged, and the method will continue performing SP soft decision decoding until all of the SP soft decision decoding iterations of the first round of SP soft decision decoding have been completed.

During the first round of SP soft decision decoding iterations, this may be shown as determining if the counter has reached a maximum number of SP soft decision decoding iterations $I_s$, e.g., if $i=I_s$. If the final iteration of SP soft decision decoding has not yet been completed, then the SP soft decision decoding counter i is again incremented as shown for i=i+1, and the next iteration of the SP soft decision decoding is performed within the first round of SP soft decision decoding. If the final iteration of SP soft decision decoding has in fact been completed, then the method will store the variable node information, v, for subsequent use in BF hard decision decoding. This initial variable node information, v, is used as the initial condition, j=0, for the BF hard decision decoding. A BF hard decision decoding counter, j, is then incremented as shown for j=j+1, and the BF hard decision decoding is then performed using that counter.

At this point, it may then be determined if all of the syndromes are equal to zero. If all of the syndromes are in fact equal to zero, then the method has converged, and the method may then output the estimated codeword at this point after performing at least one iteration of BF hard decision decoding. Alternatively, if all of the syndromes are not equal to zero, then the method has not yet converged, and the method will continue to perform BF hard decision decoding until the method reaches a maximum number of BF hard decision decoding iterations $J_h$, e.g., if j=$J_h$. If the BF hard decision decoding has not yet reached the final BF hard decision decoding iteration, then the method will increment the BF hard decision decoding counter as shown for j=j+1.

When the BF hard decision decoding has in fact reached the final BF hard decision decoding iteration, then the method will store the estimated codeword at this point, and the method will make hard decisions on the metrics corresponding to this estimated codeword. The variable node information, v, will then be initialized using the enlarged metrics (sometimes referred to as scaled metrics) based on the hard decisions made above based on the metrics of the received signal. This variable node information, v, is then used as the initial conditions, i=0, for additional SP soft decision decoding iterations. The SP soft decision decoding counter will then be incremented (based from its previous, final value in the first round of SP soft decision decoding) as shown for i=i+1, and the method will continue to perform additional SP soft decision decoding iterations. At this point, it will then again be determined of all of the syndromes are equal to zero. It is noted that this determination of whether the syndromes are all equal to zero may be performed at a last iteration of the additional SP soft decision decoding iterations. If all of the syndromes are in fact equal to zero, then the method has converged, and the method may then output the estimated codeword. However, if the all of the syndromes are not yet equal to zero, the method will continue to perform additional SP soft decision decoding iterations until a maximum number of additional SP soft decision decoding iterations have been performed, as shown by $I_{es}$, e.g., if i=$I_{es}$.

Thereafter, if all of these additional SP soft decision decoding iterations have not in fact been performed, then the method will increment the SP soft decision decoding counter as shown for i=i+1, and the method will continue to perform additional SP soft decision decoding iterations until the maximum number of additional SP soft decision decoding iterations have been performed as described above. Clearly, when the final SP soft decision decoding iteration of the additional SP soft decision decoding iterations has been reached, then the determination of whether all of the syndromes are equal to zero may then be made. When the maximum number of additional SP soft decision decoding iterations have in fact been performed, and if all of the syndromes are not equal to zero, then the method will output the previously stored, estimated codeword generated by the BF hard decision decoding.

Figure 22:
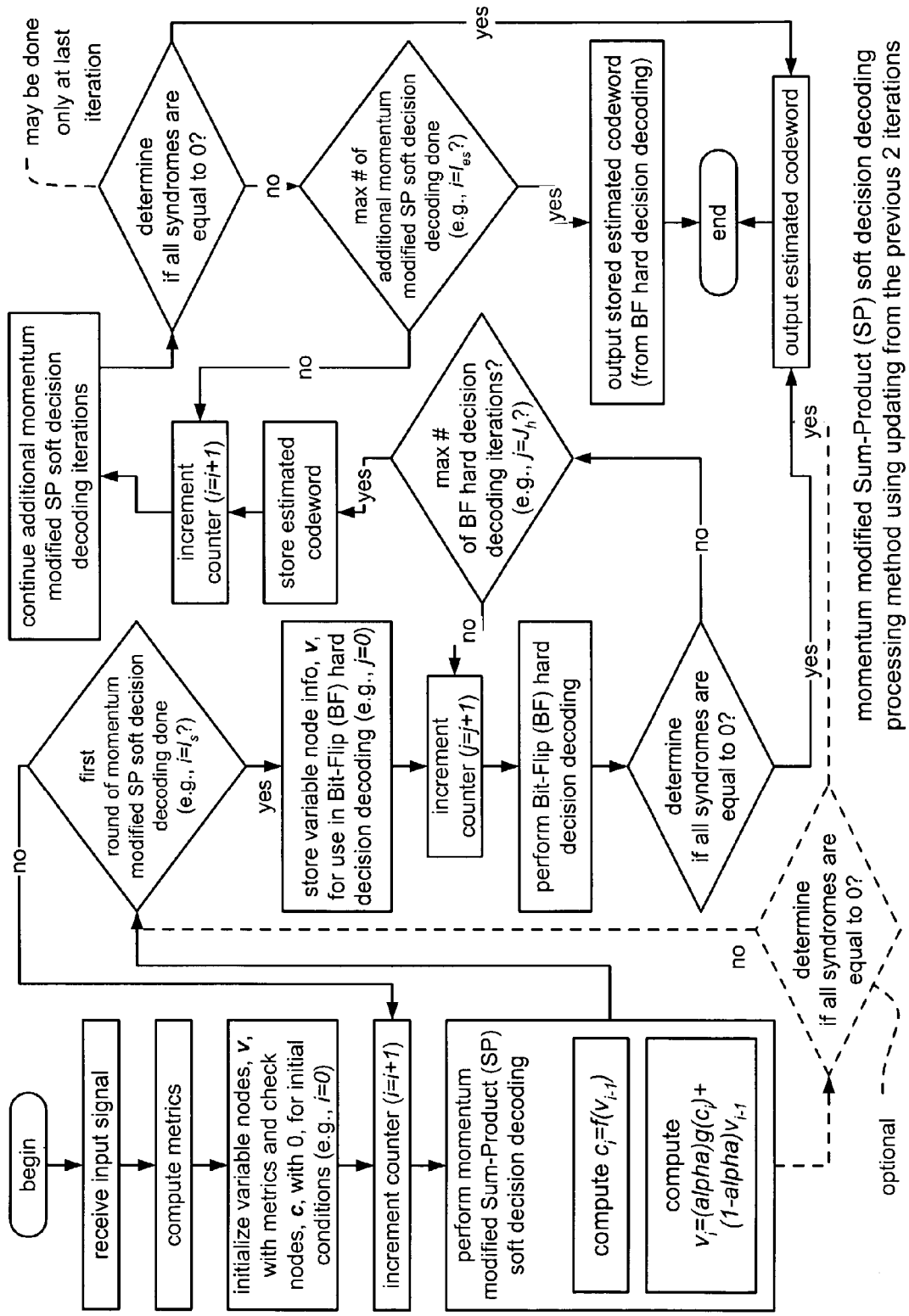
FIG. 22 is a flowchart illustrating an embodiment of a momentum modified Sum-Product (SP) soft decision decoding processing method using updating from the previous 2 iterations according to the invention.

FIG. 22 is a flowchart illustrating an embodiment of a momentum modified Sum-Product (SP) soft decision decoding processing method using updating from the previous 2 iterations according to the invention. An input signal is initially received. Then, metrics of the received signal are computed. Using these computed metrics and check nodes, c, that correspond to the initial conditions of momentum modified SP soft decision decoding, e.g., for i=0, the variable nodes, v, are initialized. This may be viewed as being for the initial conditions, e.g., i=0 for the variable nodes, v, for the first round of momentum modified SP soft decision decoding that is to be performed. Afterwards, an SP soft decision decoding counter i is incremented as shown for i=i+1. Using this SP soft decision decoding counter, i, the first round of momentum modified SP soft decision decoding is then performed. This momentum modified SP soft decision decoding may be described as follows:

The check node information of the ith iteration of the momentum modified SP soft decision decoding may be represented as $c_i=f(v_{i-1})$. In addition, the variable node information for the ith iteration of the momentum modified SP soft decision decoding may be represented as $v_i=F(\alpha v_{i-1}+(1-\alpha)v_{i-2})$. This momentum modified SP soft decision decoding involves performing updating using the previous 2 iterations as opposed to only 1 previous iteration.

If desired in some embodiments, it is then determined if all of the possible syndromes are then equal to zero in an optional decision block. This process need not necessarily be performed at this point in all embodiments. If all of the syndromes are in fact equal to zero, then the method has converged, and the method may then output the estimated codeword. Alternatively, if all of the syndromes are not equal to zero, then the method has not yet converged, and the method will continue performing SP soft decision decoding until all of the SP soft decision decoding iterations of the first round of SP soft decision decoding have been completed.

During the first round of SP soft decision decoding iterations, this may be shown as determining if the counter has reached a maximum number of momentum modified SP soft decision decoding iterations $I_s$, e.g., if i=$I_s$. If the final iteration of momentum modified SP soft decision decoding has not yet been completed, then the SP soft decision decoding counter i is again incremented as shown for i=i+1, and the next iteration of the momentum modified SP soft decision decoding is performed within the first round of momentum modified SP soft decision decoding. If the final iteration of momentum modified SP soft decision decoding has in fact been completed, then the method will store the variable node information, v, for subsequent use in BF hard decision decoding. This initial variable node information, v, is used as the initial condition, j=0, for the BF hard decision decoding. A BF hard decision decoding counter, j, is then incremented as shown for j=j+1, and the BF hard decision decoding is then performed using that counter.

At this point, it may then be determined if all of the syndromes are equal to zero. If all of the syndromes are in fact equal to zero, then the method has converged, and the method may then output the estimated codeword at this point after performing at least one iteration of BF hard decision decoding. Alternatively, if all of the syndromes are not equal to zero, then the method has not yet converged, and the method will continue to perform BF hard decision decoding until the method reaches a maximum number of BF hard decision decoding iterations $J_h$, e.g., if j=$J_h$. If the BF hard decision decoding has not yet reached the final BF hard decision decoding iteration, then the method will increment the BF hard decision decoding counter as shown for j=j+1.

When the BF hard decision decoding has in fact reached the final BF hard decision decoding iteration, then the method will store the estimated codeword at this point, and the SP soft decision decoding counter will then be incremented (based from its previous, final value in the first round of momentum modified SP soft decision decoding) as shown for i=i+1, and the method will continue to perform additional momentum modified SP soft decision decoding iterations. At this point, it will then again be determined of all of the syndromes are equal to zero. It is noted that this determination of whether the syndromes are all equal to zero may be performed at a last iteration of the additional momentum modified SP soft decision decoding iterations. If all of the syndromes are in fact equal to zero, then the method has converged, and the method may then output the estimated codeword. However, if the all of the syndromes are not yet equal to zero, the method will continue to perform additional momentum modified SP soft decision decoding iterations until a maximum number of additional momentum modified SP soft decision decoding iterations have been performed, as shown by $I_{es}$, e.g., if $i=I_{es}$.

Thereafter, if all of these additional momentum modified SP soft decision decoding iterations have not in fact been performed, then the method will increment the SP soft decision decoding counter as shown for i=i+1, and the method will continue to perform additional momentum modified SP soft decision decoding iterations until the maximum number of additional momentum modified SP soft decision decoding iterations have been performed as described above. Clearly, when the final momentum modified SP soft decision decoding iteration of the additional momentum modified SP soft decision decoding iterations has been reached, then the determination of whether all of the syndromes are equal to zero may then be made. When the maximum number of additional SP soft decision decoding iterations have in fact been performed, and if all of the syndromes are not equal to zero, then the method will output the previously stored, estimated codeword generated by the BF hard decision decoding.

It is noted that the methods described within the preceding figures may also be performed within any of the appropriate designs (communication systems, communication receivers and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a Sum-Product (SP) soft decision decoder that performs a plurality of soft decision decoding iterations to generate a plurality of soft decisions corresponding to bits within a Low Density Parity Check (LDPC) coded signal that is received from a communication channel, wherein the SP soft decision decoder is initialized based on the LDPC signal that is received from the communication channel and channel information corresponding to the communication channel over which the LDPC coded signal has been communicated;

wherein the SP soft decision decoder generates a first plurality of hard decisions using the plurality of soft decisions generated during at least one soft decision decoding iteration of the plurality of soft decision decoding iterations; and
a Bit-Flip (BF) hard decision decoder that performs a plurality of hard decision decoding iterations on the first plurality of hard decisions generated by the SP soft decision decoder to generate a second plurality of hard decisions.

2. The apparatus of claim 1, wherein the plurality of soft decision decoding iterations performed by the SP soft decision decoder is a predetermined number of soft decision decoding iterations.

3. The apparatus of claim 1, wherein the at least one soft decision decoding iteration is a last soft decision decoding iteration of the plurality of soft decision decoding iterations that is performed by the SP soft decision decoder when a number of bit errors within the plurality of soft decisions is less than a predetermined threshold.

4. The apparatus of claim 1, wherein the plurality of hard decision decoding iterations performed by the BF hard decision decoder is a predetermined number of hard decision decoding iterations.

5. The apparatus of claim 1, wherein a last hard decision decoding iteration of the plurality of hard decision decoding iterations is performed by the BF hard decision decoder when a number of bit errors within the plurality of hard decisions is less than a predetermined threshold.

6. The apparatus of claim 1, wherein the SP soft decision decoder performs not more that 6 soft decision decoding iterations; and
wherein the BF hard decision decoder performs not more than 2 hard decision decoding iterations.

7. The apparatus of claim 1, wherein information corresponding to a plurality of variable nodes is initialized using hard decisions generated from a plurality of metrics that is based on a plurality of received symbols within the LDPC coded signal and channel information corresponding to the communication channel over which the LDPC coded signal has been communicated: and
wherein the initialized information corresponding to the plurality of variable nodes is used by the SP soft decision decoder before performing a first soft decision decoding iteration of the plurality of soft decision decoding iterations.

8. The apparatus of claim 1, wherein a plurality of metrics is based on a plurality of received symbols within the LDPC coded signal and channel information corresponding to the communication channel over which the LDPC coded signal has been communicated;
wherein metrics within the plurality of metrics are selectively scaled, based on a Signal to Noise Ratio (SNR) of the communication channels to generate a plurality of scaled metrics;
wherein information corresponding to a plurality of variable nodes is initialized using hard decisions generated from the plurality of scaled metrics; and
wherein the initialized information corresponding to the plurality of variable nodes is used by the SP soft decision decoder before performing a first soft decision decoding iteration of the plurality of soft decision decoding iterations.

9. The apparatus of claim 1, further comprising a syndrome error detection functional block that is operable to detect a bit error within the second plurality of hard decisions after the BF hard decision decoder performs the plurality of hard decision decoding iterations on the first plurality of hard decisions generated by the SP soft decision decoder.

10. The apparatus of claim 9, wherein the SP soft decision decoder performs an additional plurality of soft decision decoding iterations when the syndrome error detection functional block detects the bit error within the second plurality of hard decisions.

11. The apparatus of claim 10, wherein the BF hard decision decoder outputs a hard decision decoding result when the SP soft decision decoder fails to eliminate the bit error after performing the additional plurality of soft decision decoding iterations; and
    wherein the hard decision decoding result output from the BF hard decision decoder includes an estimated codeword of the LDPC coded signal.

12. The apparatus of claim 10, wherein information corresponding to a plurality of variable nodes is initialized using hard decisions generated from a plurality of metrics that is based on a plurality of received symbols within the LDPC coded signal and channel information corresponding to the communication channel over which the LDPC coded signal has been communicated; and
    wherein the initialized information corresponding to the plurality of variable nodes is used by the SP soft decision decoder before performing a first soft decision decoding iteration of the additional plurality of soft decision decoding iterations.

13. The apparatus of claim 10, wherein a plurality of metrics is based on a plurality of received symbols within the LDPC coded signal and channel information corresponding to the communication channel over which the LDPC coded signal has been communicated;
    wherein metrics within the plurality of metrics are selectively scaled, based on a Signal to Noise Ratio (SNR) of the communication channel, to generate a plurality of scaled metrics;
    wherein information corresponding to a plurality of variable nodes is initialized using hard decisions generated from the plurality of scaled metrics; and
    wherein the initialized information corresponding to the plurality of variable nodes is used by the SP soft decision decoder before performing a first soft decision decoding iteration of the additional plurality of soft decision decoding iterations.

14. The apparatus of claim 1, wherein the SP soft decision decoder performs momentum modified SP soft decision decoding processing that involves updating the plurality of soft decisions using information corresponding to 2 previous soft decision decoding iterations of the plurality of soft decision decoding iterations.

15. The apparatus of claim 1, wherein the apparatus is a decoder that is implemented within a communication receiver; and
    the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

16. An apparatus, comprising:
    a Sum-Product (SP) soft decision decoder that performs a plurality of soft decision decoding iterations to generate a plurality of soft decisions corresponding to bits within a Low Density Parity Check (LDPC) coded signal;
    wherein the SP soft decision decoder performs momentum modified SP soft decision decoding processing that involves updating the plurality of soft decisions using information corresponding to 2 previous soft decision decoding iterations of the plurality of soft decision decoding iterations;
    wherein the SP soft decision decoder generates a first plurality of hard decisions using the plurality of soft decisions generated during at least one soft decision decoding iteration of the plurality of soft decision decoding iterations;
    a Bit-Flip (BF) hard decision decoder that performs a plurality of hard decision decoding iterations on the first plurality of hard decisions generated by the SP soft decision decoder to generate a second plurality of hard decisions;
    a syndrome error detection functional block that is operable to detect a bit error within the second plurality of hard decisions after the BF hard decision decoder performs the plurality of hard decision decoding iterations on the first plurality of hard decisions generated by the SP soft decision decoder; and
    wherein the SP soft decision decoder performs an additional plurality of soft decision decoding iterations when the syndrome error detection functional block detects the bit error within the second plurality of hard decisions.

17. The apparatus of claim 16, wherein the plurality of soft decision decoding iterations performed by the SP soft decision decoder is a predetermined number of soft decision decoding iterations.

18. The apparatus of claim 16, wherein the at least one soft decision decoding iteration is a last soft decision decoding iteration of the plurality of soft decision decoding iterations that is performed by the SP soft decision decoder when a number of bit errors within the plurality of soft decisions is less than a predetermined threshold.

19. The apparatus of claim 16, wherein the plurality of hard decision decoding iterations performed by the BF hard decision decoder is a predetermined plurality of hard decision decoding iterations.

20. The apparatus of claim 16, wherein a last hard decision decoding iteration of the plurality of hard decision decoding iterations is performed by the BF hard decision decoder when a number of bit errors within the plurality of hard decisions is less than a predetermined threshold.

21. The apparatus of claim 16, wherein the SP soft decision decoder performs not more that 6 soft decision decoding iterations; and
    wherein the BF hard decision decoder performs not more than 2 hard decision decoding iterations.

22. The apparatus of claim 16, wherein information corresponding to a plurality of variable nodes is initialized using hard decisions generated from a plurality of metrics that is based on a plurality of received symbols within the LDPC coded signal and channel information corresponding to a communication channel over which the LDPC coded signal has been communicated; and
    wherein the initialized information corresponding to the plurality of variable nodes is used by the SP soft decision decoder before performing a first soft decision decoding iteration of the plurality of soft decision decoding iterations.

23. The apparatus of claim 16, wherein a plurality of metrics is based on a plurality of received symbols within the LDPC coded signal and channel information corresponding to a communication channel over which the LDPC coded signal has been communicated;

wherein metrics within the plurality of metrics are selectively scaled, based on a Signal to Noise Ratio (SNR) of the communication channel, to generate a plurality of scaled metrics;

wherein information corresponding to a plurality of variable nodes is initialized using hard decisions generated from the plurality of scaled metrics; and wherein the initialized information corresponding to the plurality of variable nodes is used by the SP soft decision decoder before performing a first soft decision decoding iteration of the plurality of soft decision decoding iterations.

24. The apparatus of claim 16, wherein the BF hard decision decoder outputs a hard decision decoding result when the SP soft decision decoder fails to eliminate the bit error after performing the additional plurality of soft decision decoding iterations; and wherein the hard decision decoding result output from the BF hard decision decoder includes an estimated codeword of the LDPC coded signal.

25. The apparatus of claim 16, wherein information corresponding to a plurality of variable nodes is initialized using hard decisions generated from a plurality of metrics that is based on a plurality of received symbols within the LDPC coded signal and channel information corresponding to a communication channel over which the LDPC coded signal has been communicated; and wherein the initialized information corresponding to the plurality of variable nodes is used by the SP soft decision decoder before performing a first soft decision decoding iteration of the additional plurality of soft decision decoding iterations.

26. The apparatus of claim 16, wherein a plurality of metrics is based on a plurality of received symbols within the LDPC coded signal and channel information corresponding to a communication channel over which the LDPC coded signal has been communicated;

wherein information corresponding to a plurality of variable nodes is initialized using hard decisions generated from die plurality of metrics; and wherein the initialized information corresponding to the plurality of variable nodes is used by the SP soft decision decoder before performing a first soft decision decoding iteration of the additional plurality of soft decision decoding iterations.

27. The apparatus of claim 16, wherein:

the at least one soft decision decoding iteration is a last soft decision decoding iteration of the plurality of soft decision decoding iterations that is performed when a number of bit errors within the plurality of soft decisions is less than a predetermined threshold; and the plurality of hard decision decoding iterations is a predetermined number of hard decision decoding iterations.

28. The apparatus of claim 16, wherein the apparatus is a decoder that is implemented within a communication receiver; and the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

29. An apparatus, comprising:

a Sum-Product (SP) soft decision decoder that performs a plurality of soft decision decoding iterations to generate a plurality of soft decisions corresponding to bits within a Low Density Parity Check (LDPC) coded signal;

wherein the SP soft decision decoder generates a first plurality of hard decisions using the plurality of soft decisions generated during at least one soft decision decoding iteration of the plurality of soft decision decoding iterations;

a Bit-Flip (BF) hard decision decoder that performs a plurality of hard decision decoding iterations on the first plurality of hard decisions generated by the SP soft decision decoder to generate a second plurality of hard decisions;

wherein information corresponding to a plurality of variable nodes is initialized using hard decision generated from a plurality of metrics that is based on a plurality of received symbols within the LDPC coded signal and channel information corresponding to a communication channel over which the LDPC coded signal has been communicated; and wherein the initialized information corresponding to the plurality of variable nodes is used by the SP soft decision decoder before performing a first soft decision decoding iteration of the plurality of soft decision decoding iterations.

30. The apparatus of claim 29, wherein the plurality of soft decision decoding iterations performed by the SP soft decision decoder is a predetermined number of soft decision decoding iterations.

31. The apparatus of claim 29, wherein the at least one soft decision decoding iteration is a last soft decision decoding iteration of the plurality of soft decision decoding iterations that is performed by the SP soft decision decoder when a number of bit errors within the plurality of soft decisions is less than a predetermined threshold.

32. The apparatus of claim 29, wherein the plurality of hard decision decoding iterations performed by the BF hard decision decoder is a predetermined number of hard decision decoding iterations.

33. The apparatus of claim 29, wherein a last hard decision decoding iteration of the plurality of hard decision decoding iterations is performed by the BF hard decision decoder when a number of bit errors within the plurality of hard decisions is less than a predetermined threshold.

34. The apparatus of claim 29, wherein the SP soft decision decoder performs not more that 6 soft decision decoding iterations; and wherein the BF hard decision decoder performs not more than 2 hard decision decoding iterations.

35. The apparatus of claim 29, further comprising a syndrome error detection functional block that is operable to detect a bit error Within the second plurality of hard decisions after the BF hard decision decoder performs the plurality of hard decision decoding iterations on the first plurality of hard decisions generated by the SP soft decision decoder.

36. The apparatus of claim 35, wherein the SP soft decision decoder performs an additional plurality of soft decision decoding iterations when the syndrome error detection functional block detects the bit error within the second plurality of hard decisions.

37. The apparatus of claim 36, wherein the BF hard decision decoder outputs a hard decision decoding result when the SP soft decision decoder fails to eliminate the bit error after performing the additional plurality of soft decision decoding iterations; and wherein the hard decision decoding result output from the BF hard decision decoder includes an estimated codeword of the LDPC coded signal.

38. The apparatus of claim 36, wherein information corresponding to a plurality of variable nodes is initialized using hard decisions generated from a plurality of metrics that is based on a plurality of received symbols within the LDPC coded signal and channel information corresponding to a communication channel over which the LDPC coded signal has been communicated; and wherein the initialized information corresponding to the plurality of variable nodes is used by the SP soft decision decoder before performing a first soft decision decoding iteration of the additional plurality of soft decision decoding iterations.

39. The apparatus or claim 36, wherein a plurality of metrics is based on a plurality of received symbols within the LDPC coded signal and channel information corresponding to a communication channel over which the LDPC coded signal has been communicated;

wherein metrics within the plurality of metrics are selectively scaled, based on a Signal to Noise Ratio (SNR) of the communication channel, to generate a plurality of scaled metrics;

wherein information corresponding to a plurality of variable nodes is initialized using hard decisions generated from the plurality of scaled metrics; and wherein the initialized information corresponding to the plurality of variable nodes is used by the SP soft decision decoder before performing a first soft decision decoding iteration of the additional plurality of soft decision decoding iterations.

40. The apparatus of claim 29, wherein the SP soft decision decoder performs momentum modified SP soft decision decoding processing that involves updating the plurality of soft decisions using information corresponding to 2 previous soft decision decoding iterations of the plurality of soft decision decoding iterations.

41. The apparatus of claim 29, wherein the decoder is implemented within a communication receiver; and the communication receiver is contained within at least one of a satellite communication system, a High Definition Television (HDTV) communication system, a cellular communication system, a microwave communication system, a point-to-point communication system, a uni-directional communication system, a hi-directional communication system, a one to many communication system, and a fiber-optic communication system.

42. An apparatus, comprising:

a Sum-Product (SP) soft decision decoder that performs a plurality of soft decision decoding iterations to generate a plurality of soft decisions corresponding to bits within Low Density Parity Check (LDPC) coded signal;

wherein the SP soft decision decoder generates a first plurality of hard decisions using thy plurality of soft decisions generated during at least one soft decision decoding iteration of the plurality of soft decision decoding iterations;

a Bit-Flip (BF) hard decision decoder that performs a plurality of hard decision decoding iterations on the first plurality of hard decisions generated by the SP soil decision decoder to generate a second plurality of hard decisions;

wherein a plurality of metrics is based on a plurality of received symbols within the LDPC coded signal and channel information corresponding to a communication channel over which the LDPC coded signal has been communicated;

wherein metrics within the plurality of metrics are selectively scaled, based on a Signal to Noise Ratio (SNR) of the communication channel, to generate a plurality of scaled metrics;

wherein information corresponding to a plurality of variable nodes is initialized using hard decisions generated from the plurality of scaled metrics; and wherein the initialized information corresponding to the plurality of variable nodes is used by the SP soft decision decoder before performing a first soft decision decoding iteration of the plurality of soft decision decoding iterations.

43. The apparatus of claim 42, wherein the plurality of soft decision decoding iterations performed by the SP soft decision decoder is a predetermined number of soft decision decoding iterations.

44. The apparatus of claim 42, wherein the at least one soft decision decoding iteration is a last soft decision decoding iteration of the plurality of soft decision decoding iterations that is performed by the SP soft decision decoder when a number of bit errors within the plurality of soft decisions is less than a predetermined threshold.

45. The apparatus of claim 42, wherein the plurality of hard decision decoding iterations performed by the BF hard decision decoder is a predetermined number of hard decision decoding iterations.

46. The apparatus of claim 42, wherein a last hard decision decoding iteration of the plurality of hard decision decoding iterations is performed by the BF hard decision decoder when a number of bit errors within the plurality of hard decisions is less than a predetermined threshold.

47. The apparatus of claim 42, wherein the SP soft decision decoder performs not more that 6 soft decision decoding iterations; and wherein the BF hard decision decoder performs not more than 2 hard decision decoding iterations.

48. The apparatus of claim 42, further comprising a syndrome error detection functional block that is operable to detect a bit error within the second plurality of hard decisions after the BF hard decision decoder performs the plurality of hard decision decoding iterations on the first plurality of hard decisions generated by the SP soft decision decoder.

49. The apparatus of claim 48, wherein the SP soft decision decoder performs an additional plurality of soft decision decoding iterations when the syndrome error detection functional block detects the bit error within the second plurality of hard decisions.

50. The apparatus of claim 49, wherein the BF hard decision decoder outputs a hard decision decoding result when the SP soft decision decoder fails to eliminate the bit error after performing the additional plurality of soft decision decoding iterations; and wherein the hard decision decoding result output from the BF hard decision decoder includes an estimated codeword of the LDPC coded signal.

51. The apparatus of claim 49, wherein information corresponding to a plurality of variable nodes is initialized using hard decisions generated from a plurality of metrics that is based on a plurality of received symbols within the LDPC coded signal and channel information corresponding to a communication channel over which the LDPC coded signal has been communicated; and wherein the initialized information corresponding to the plurality of variable nodes is used by the SP soft decision decoder before performing a first soft decision decoding iteration of the additional plurality of soft decision decoding iterations.

52. The apparatus of claim 49, wherein a plurality of metrics is based on a plurality of received symbols within the LDPC coded signal and channel information corresponding to a communication channel over which the LDPC coded signal has been communicated;

wherein metrics within the plurality of metrics are selectively scaled, based on a Signal to Noise Ratio (SNR) of the communication channel, to generate a plurality of scaled metrics;

wherein information corresponding to a plurality of variable nodes is initialized using hard decisions generated from the plurality of scaled metrics; and wherein the initialized information corresponding to the plurality of variable nodes is used by the SP soft decision decoder before performing a first soft decision decoding iteration of the additional plurality of soft decision decoding iterations.

53. The apparatus of claim 42, wherein, the SP soft decision decoder performs momentum, modified SP soft decision decoding processing that involves updating the plurality of soft decisions using information corresponding to 2 previous soft decision decoding iterations of the plurality of soft decision decoding iterations.

54. The apparatus of claim 42, wherein the apparatus is a decoder that is implemented within a communication receiver; and the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

55. A method comprising:

Sum-Product (SP) soft decision decoding to perform a plurality of soft decision decoding iterations to generate a plurality of soft decisions corresponding to bits within a Low Density Parity Check (LDPC) coded signal that is received from a communication channel, wherein the SP soft decision decoding is initialized based on the LDPC signal that is received from the communication channel and channel information corresponding to the communication channel over which the LDPC coded signal has been communicated;

generating a first plurality of hard decisions using the soft decisions generated during at least one soft decision decoding iteration of the plurality of soft decision decoding iterations; and Bit-Flip (BF) hard decision decoding to perform a plurality of hard decision decoding iterations on the first plurality of hard decisions generated by the SP soft decision decoding to generate a second plurality of hard decisions.

56. The method of claim 55, wherein the plurality of soft decision decoding iterations is a predetermined number of soft decision decoding iterations.

57. The method of claim 55, wherein the at least one soft decision decoding iteration is a last soft decision decoding iteration of the plurality of soft decision decoding iterations that is performed when a number of bit errors within the plurality of soft decisions is less than a predetermined threshold.

58. The method of claim 55, wherein the plurality of hard decision decoding iterations is a predetermined number of hard decision decoding iterations.

59. The method of claim 55, wherein a last hard decision decoding iteration of the plurality of hard decision decoding iterations is performed when a number of bit errors within the second plurality of hard decisions is less than a predetermined threshold.

60. The method of claim 55, wherein the SP soft decision decoding performs not more that 6 soft decision decoding iterations; and wherein the BF hard decision decoding performs not more than 2 hard decision decoding iterations.

61. The method of claim 55, further comprising:

initializing information corresponding to a plurality of variable nodes using hard decisions generated from a plurality of metrics that is based on a plurality of received symbols within the LDPC coded signal and channel information corresponding to the communication channel over which the LDPC coded signal has been communicated; and using the initialized information corresponding to the plurality of variable nodes to initialize a first soft decision decoding iteration of the plurality of soft decision decoding iterations.

62. The method of claim 55, wherein a plurality of metrics is based on a polarity of received symbols within the LDPC coded signal and channel information corresponding to the communication channel over which the LDPC coded signal has been communicated;

further comprising:

selectively scaling the plurality of metrics, based on a Signal to Noise Ratio (SNR) of the communication channel, to generate a plurality of scaled metrics;

generating hard decisions from the plurality of scaled metrics;

initializing information corresponding to a plurality of variable nodes using the hard decisions generated from the plurality of scaled metrics; and using the initialized information corresponding to the plurality of variable nodes to initialize a first soft decision decoding iteration of the plurality of soft decision decoding iterations.

63. The method of claim 55, further comprising:

detecting a bit error within the second plurality of hard decisions after the plurality of hard decision decoding iterations is made on the first plurality of hard decisions generated during the at least one soft decision decoding iteration of the plurality of soft decision decoding iterations.

64. The method of claim 63, further comprising:

performing an additional plurality of soft decision decoding iterations when a bit error has been detected within the second plurality of hard decisions.

65. The method of claim 64, further comprising:

outputting a hard decision decoding results when the additional plurality of soft decision decoding iterations fails to eliminate the bit error; and wherein the hard decision decoding result output includes an estimated codeword of the LDPC coded signal.

66. The method of claim 64, further comprising:
initializing information corresponding to a plurality of variable nodes using hard decisions generated from a plurality of metrics that is based an a plurality of received symbols within the LDPC coded signal and channel information corresponding to the communication channel over which the LDPC coded signal has been communicated; and
using the initialized information corresponding to the plurality of variable nodes to initialize a first soft decision decoding iteration of the additional plurality of soft decision decoding iterations.

67. The method of claim 64, wherein a plurality of metrics is based on a plurality of received symbols within the LDPC coded signal and channel information corresponding to the communication channel over which the LDPC coded signal has been communicated;
further comprising;
selectively scaling the plurality of metrics, based on a Signal to Noise Ratio (SNR) of the communication channel, to generate a plurality of scaled metrics;
generating hard decisions from the plurality of scaled metrics;
initializing information corresponding to a plurality of variable nodes using the hard decisions generated from the plurality of scaled metrics; and
using the initialized information corresponding to the plurality of variable nodes to initialize a first soft decision decoding iteration of the additional plurality of soft decision decoding iterations.

68. The method of claim 55, wherein the SP soft decision decoding involves performing momentum modified SP soft decision decoding processing that involves updating the plurality of soft decisions using information corresponding to 2 previous soft decision decoding iterations of the plurality of soft decision decoding iterations.

69. The method of claim 55, wherein the method is performed within a decoder that is implemented within a communication receiver; and
the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

70. A method, comprising;
Sum-Product (SP) soft decision decoding to perform a plurality of soft decision decoding iterations to generate a plurality of soft decisions corresponding to bits within a Low Density Parity Check (LDPC) coded signal;
wherein the SP soft decision decoding performs momentum modified SP soft decision decoding processing that involves updating the plurality of soft decisions using information corresponding to 2 previous soft decision decoding iterations of the plurality of soft decision decoding iterations;
generating a first plurality of hard decisions using the soft decisions generated during at least one soft decision decoding iteration to the plurality of soft decision decoding iterations;
Bit-Flip (BF) hard decision decoding to perform a plurality of hard decision decoding iterations on the first plurality of hard decisions generated by the SP soft decision decoding to generate a second plurality of hard decisions;
detecting a bit error within the second plurality of hard decisions after the plurality of hard decision decoding iterations is made on the first plurality of hard decisions generated during the at least one soft decision decoding iteration of the plurality of soft decision decoding iterations; and
additional SP soft decision decoding to perform an additional plurality of soft decision decoding iterations when a bit error has been detected within the second plurality of hard decisions.

71. The method of claim 70, wherein the plurality of soft decision decoding iterations is a predetermined number of soft decision decoding iterations.

72. The method of claim 70, wherein the at least one soft decision decoding iteration is a last soft decision decoding iteration of the plurality of soft decision decoding iterations that is performed when a number of bit errors within the plurality of soft decisions is less than a predetermined threshold.

73. The method of claim 70, wherein the plurality of hard decision decoding iterations is a predetermined number of hard decision decoding iterations.

74. The method of claim 70, wherein a last hard decision decoding iteration of the plurality of hard decision decoding iterations is performed when a number of bit errors within the plurality of hard decisions is less than a predetermined threshold.

75. The method of claim 70, wherein the SP soft decision decoding performs not more that 6 soft decision decoding iterations; and
wherein the BF hard decision decoding performs not more than 2 hard decision decoding iterations.

76. The method of claim 70, further comprising:
initializing information corresponding to a plurality of variable nodes using hard decisions generated from a plurality of metrics that is based on a plurality of received symbols within the LDPC coded signal and channel information corresponding to a communication channel over which the LDPC coded signal has been communicated; and
using the initialized information corresponding to the plurality of variable nodes to initialize a first soft decision decoding iteration of the plurality of soft decision decoding iterations.

77. The method of claim 70, wherein a plurality of metrics is based on a plurality of received symbols within the LDPC coded signal and channel information corresponding to a communication channel over which the LDPC coded signal has been communicated;
further comprising:
selectively scaling the plurality of metrics, based on a Signal to Noise Ratio (SNR) of the communication channel, to generate a plurality of sealed metrics;
generating hard decisions from the plurality of scaled metrics;
initializing information corresponding to a plurality of variable nodes using the hard decisions generated from the plurality of scaled metrics; and
using the initialized information corresponding to the plurality of variable nodes to initialize a first soft decision decoding iteration of the plurality of soft decision decoding iterations.

78. The method of claim 70, further comprising:
outputting a hard decision decoding result when the additional plurality at soft decision decoding iterations fails to eliminate the bit error; and
wherein the hard decision decoding result output includes an estimated codeword of the LDPC coded signal.

79. The method of claim 70, further comprising:
initializing information corresponding to a plurality of variable nodes using hard decisions generated from a plurality of metrics that is based on a plurality of received symbols within the LDPC coded signal and channel information corresponding to a communication channel over which the LDPC coded signal has been communicated; and
using the initialized information corresponding to the plurality of variable nodes to initialize a first soft decision decoding iteration of the additional plurality of soft decision decoding iterations.

80. The method of claim 70, wherein a plurality of metrics is based on a plurality of received symbols within the LDPC coded signal and channel information corresponding to a communication channel over which the LDPC coded signal has been communicated; and further comprising:
generating hard decisions from the plurality of metrics;
initializing information corresponding to a plurality of variable nodes using the hard decisions; and
using the initialized information corresponding to the plurality of variable nodes to initialize a first soft decision decoding iteration of the additional plurality of soft decision decoding iterations.

81. The method of claim 70, wherein:
the at least one soft decision decoding iteration is a last soft decision decoding iteration of the plurality of soft decision decoding iterations that is performed when a number of bit errors within the plurality of soft decisions is less than a predetermined threshold; and
the plurality of hard decision decoding iterations is a predetermined number of hard decision decoding iterations.

82. The method of claim 70, wherein the method is performed within a decoder that is implemented within a communication receiver; and
the communication receiver is contained within at least one of a satellite communication system, a High Definition Television (HDTV) communication system, a cellular communication system, a microwave communication system a point-to-point communication system, a uni-directional communication system, a bi-directional communication system, a one to many communication system, and a fiber-optic communication system.

* * * * *

UNITED STATES PATENT AND TRADEMARK OFFICE
CERTIFICATE OF CORRECTION

PATENT NO. : 7,296,216 B2
APPLICATION NO. : 10/370136
DATED : November 13, 2007
INVENTOR(S) : Ba-Zhong Shen et al.

It is certified that error appears in the above-identified patent and that said Letters Patent is hereby corrected as shown below:

Column 28, line 54, in Claim 8: replace "channels" with --channel,--

Column 32, line 58, in Claim 35: replace "Within" with --within--

Column 33, lines 52-53, in Claim 41: replace "hi-directional" with --bi-directional--

Column 34, line 1, in Claim 42: replace "soil" with --soft--

Column 35, line 28, in Claim 53: replace "momentum," with --momentum--

Column 36, line 34, in Claim 62: replace "polarity" with --plurality--

Column 36, line 63, in Claim 65: replace "results" with --result--

Signed and Sealed this

Twenty-second Day of July, 2008

JON W. DUDAS
*Director of the United States Patent and Trademark Office*